(12) United States Patent
Schindler et al.

(10) Patent No.: US 10,515,879 B2
(45) Date of Patent: Dec. 24, 2019

(54) PACKAGE WITH COMPONENT CONNECTED AT CARRIER LEVEL

(71) Applicant: Infineon Technologies AG, Neubiberg (DE)

(72) Inventors: Manfred Schindler, Regensburg (DE); Klaus Elian, Alteglofsheim (DE); Volker Strutz, Tegernheim (DE); Horst Theuss, Wenzenbach (DE); Michael Weber, Mainburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/992,958

(22) Filed: May 30, 2018

(65) Prior Publication Data

US 2018/0350727 A1  Dec. 6, 2018

(30) Foreign Application Priority Data

May 30, 2017  (DE) .......................... 10 2017 111 824

(51) Int. Cl.
*H01L 23/495* (2006.01)
*H01L 23/31* (2006.01)

(52) U.S. Cl.
CPC .... *H01L 23/49541* (2013.01); *H01L 23/4952* (2013.01); *H01L 23/49562* (2013.01); *H01L 23/49589* (2013.01); *H01L 23/3107* (2013.01); *H01L 23/49558* (2013.01); *H01L 2224/05554* (2013.01); *H01L 2224/16245* (2013.01); *H01L 2224/48091* (2013.01); *H01L 2224/48247* (2013.01); *H01L 2924/181* (2013.01); *H01L 2924/19105* (2013.01)

(58) Field of Classification Search
CPC ........... H01L 23/49562; H01L 23/4952; H01L 23/49541; H01L 23/49589
USPC ......................................................... 257/676
See application file for complete search history.

(56) References Cited

U.S. PATENT DOCUMENTS

| | | | |
|---|---|---|---|
| 6,303,872 B1 * | 10/2001 | Jairazbhoy | H05K 3/3442 |
| | | | 174/260 |
| 6,974,909 B2 * | 12/2005 | Tanaka | G06K 19/0723 |
| | | | 174/529 |
| 7,005,325 B2 * | 2/2006 | Chow | H01L 21/56 |
| | | | 257/676 |
| 8,023,279 B2 * | 9/2011 | Qian | H01L 23/49524 |
| | | | 361/764 |
| 9,228,860 B2 * | 1/2016 | Sharma | G01D 11/245 |
| 9,681,566 B2 * | 6/2017 | Bemmerl | H01L 33/44 |
| 9,997,444 B2 * | 6/2018 | Meyer | H01L 23/49822 |
| 2002/0121680 A1 | 9/2002 | Ahn et al. | |
| 2009/0097222 A1 | 4/2009 | Babutzka et al. | |

FOREIGN PATENT DOCUMENTS

| | | |
|---|---|---|
| DE | 10 2008 063 863 | 7/2010 |
| DE | 10 2011 079 050 | 1/2013 |

* cited by examiner

*Primary Examiner* — Luan C Thai

(74) *Attorney, Agent, or Firm* — Dicke, Billig & Czaja, PLLC

(57) ABSTRACT

A package and method of manufacturing a package is disclosed. In one example, the package includes a carrier having an accommodation through hole. A component is arranged at least partially within the accommodation through hole. A connection structure connects the carrier with the component.

18 Claims, 13 Drawing Sheets

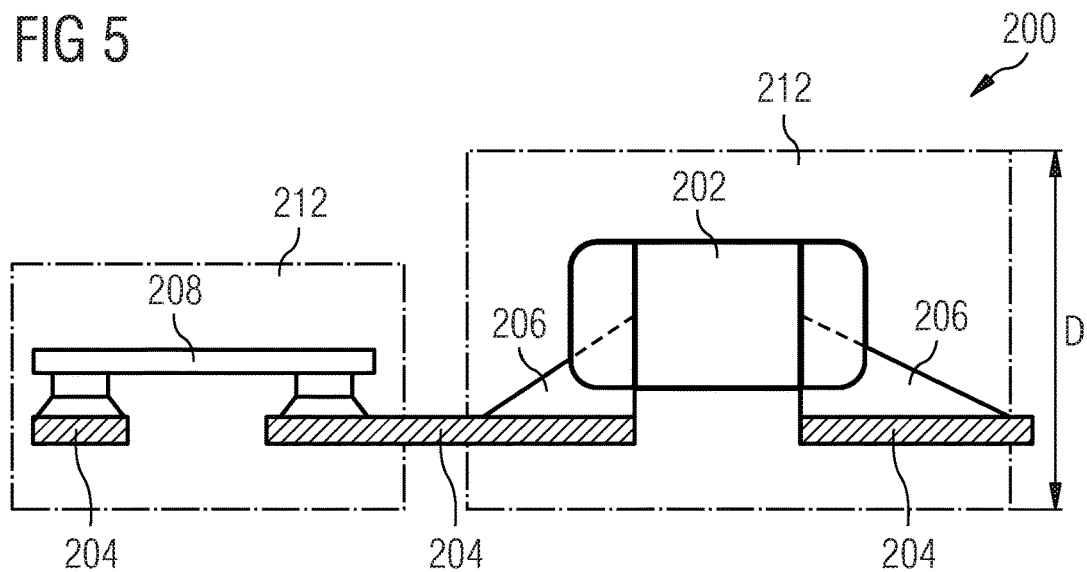
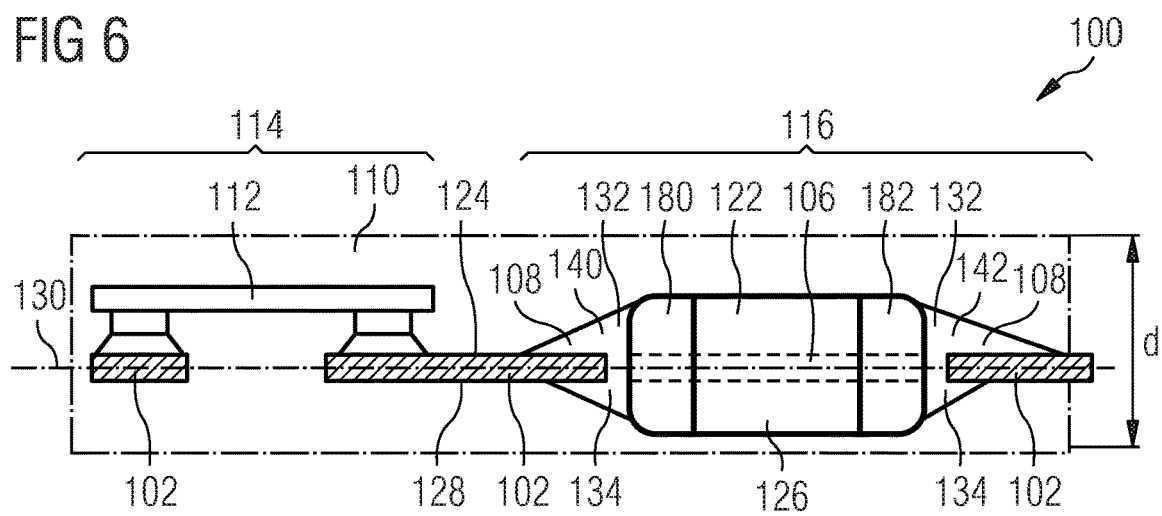
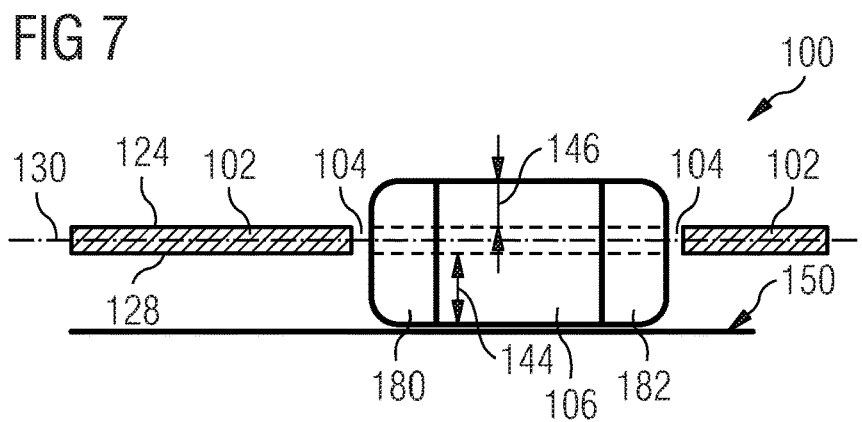

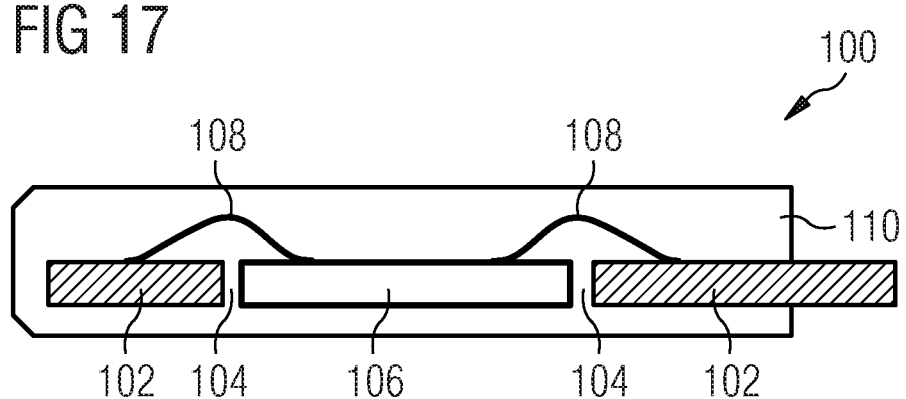
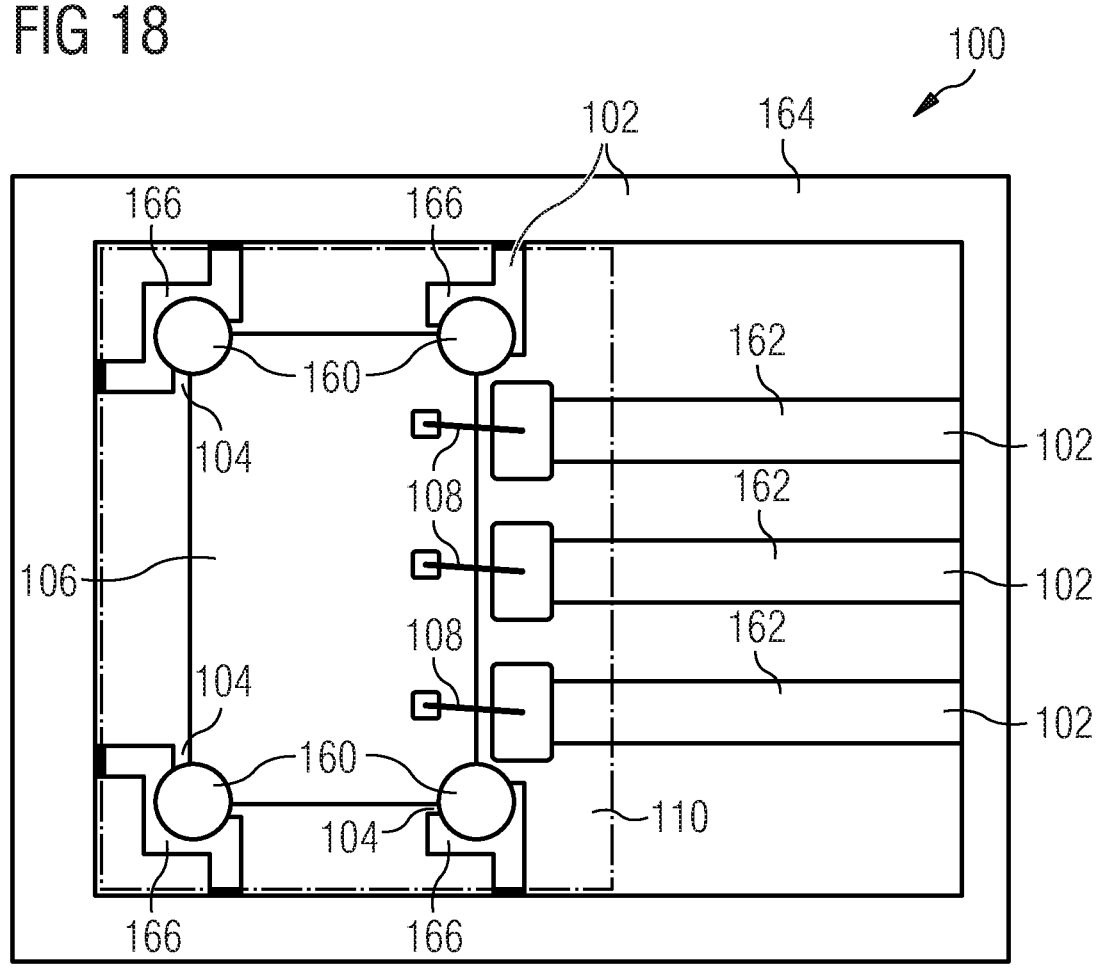

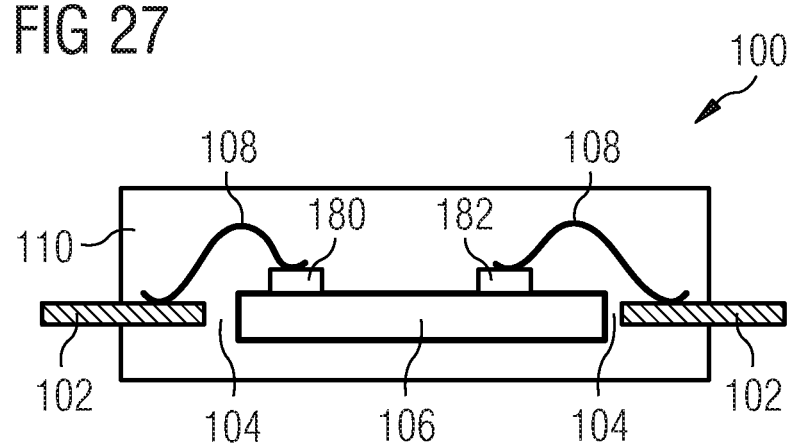
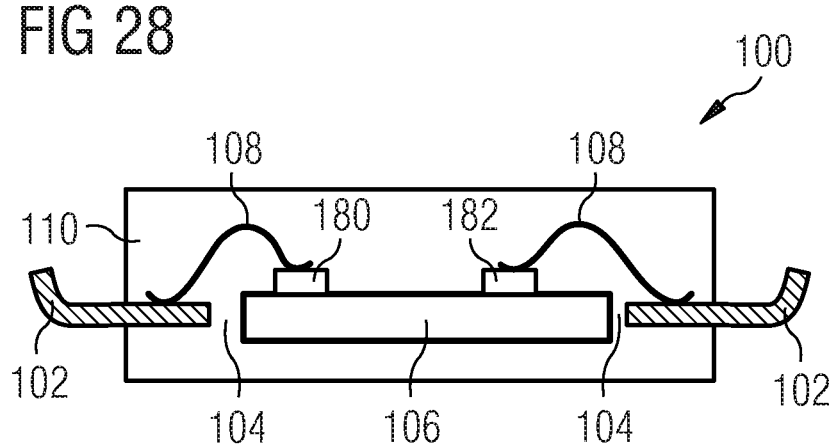

PACKAGE WITH COMPONENT CONNECTED AT CARRIER LEVEL

CROSS-REFERENCE TO RELATED APPLICATION

This Utility Patent Application claims priority to German Patent Application No. 10 2017 111 824.1, filed May 30, 2017, which is incorporated herein by reference.

FIELD OF THE INVENTION

The present invention relates to packages, and methods of manufacturing a package.

BACKGROUND

Conventional semiconductor devices, such as mold structures, for electronic chips have evolved to a level where the package no longer significantly impedes the performance of the electronic chips. Moreover, processing electronic chips on wafer level is a known procedure for efficiently producing them. Encapsulating electronic chips during package manufacture may protect them against the environment.

However, there is still potentially room to improve compactness and simplify processing when assembling components on a carrier.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 5 shows a cross-sectional view of a conventional package.

FIG. 6 shows a cross-sectional view of a package according to an exemplary embodiment.

FIG. 7 to FIG. 11 show cross-sectional views of intermediate structures obtained during carrying out a method of manufacturing a package according to an exemplary embodiment.

FIG. 17 shows a cross-sectional view of the package according to FIG. 16.

FIG. 18 to FIG. 22 show plan views of packages according to other exemplary embodiments.

FIG. 23 to FIG. 28 show cross-sectional views of intermediate structures obtained during carrying out a method of manufacturing a package according to an exemplary embodiment.

DETAILED DESCRIPTION OF EXEMPLARY EMBODIMENTS

Figure 1:
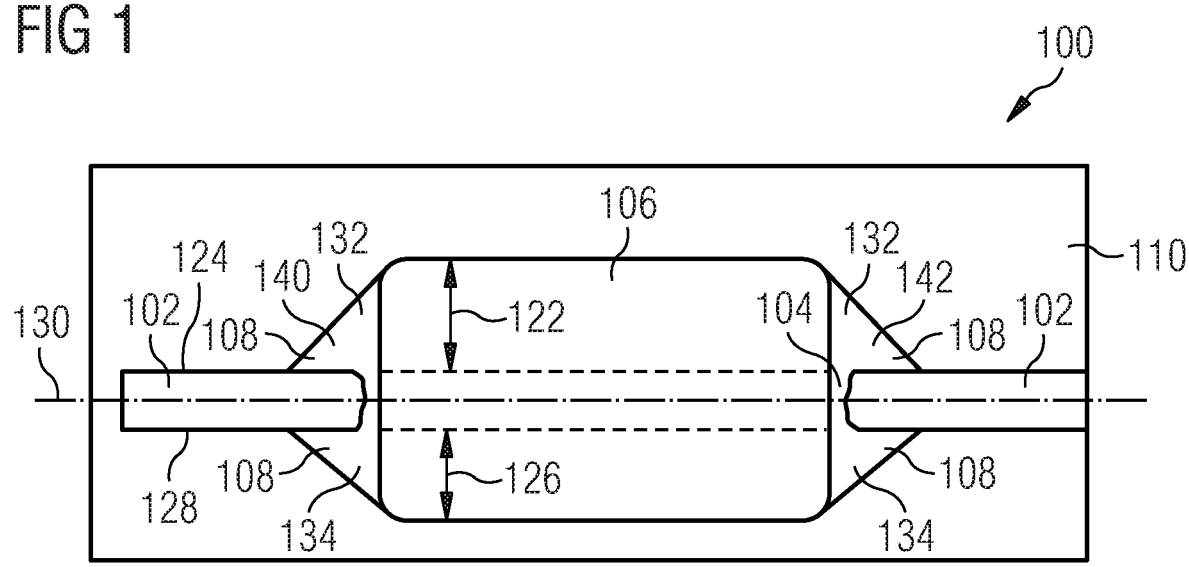
FIG. 1 shows a cross-sectional view of a package according to an exemplary embodiment.

There is a need for a reliable method of manufacturing a package with small thickness.

According to an exemplary embodiment, a package is provided which comprises a carrier having an accommodation through hole, a component arranged at least partially within the accommodation through hole, and a connection structure connecting the carrier with the component.

According to another exemplary embodiment, a package is provided which comprises a carrier, a component located at least partially on carrier level, a connection structure connecting the carrier with the component, and an encapsulant encapsulating at least part of the carrier and the component.

According to yet another exemplary embodiment, a method of manufacturing a package is provided which comprises providing a carrier with an accommodation through hole, arranging a component at least partially within the accommodation through hole, and forming a connection structure connecting the carrier with the component.

According to yet another exemplary embodiment, a method of manufacturing a package is provided wherein the method comprises mounting a component on the carrier so that the component is located at least partially on carrier level, connecting the carrier with the component by a connection structure, and encapsulating at least part of the carrier and the component.

According to an exemplary embodiment, a package is provided in which a component is mounted at a carrier in such a way, that at least part of the component is located at carrier level within an accommodation through hole of the carrier. By mounting the component at least partially within the accommodation through hole rather than entirely above the carrier and hence also above the accommodation through hole, the vertical dimension of the obtained package can be significantly reduced. Thereby, a compact package may be manufactured in which the component is very reliably mechanically connected to the carrier. Descriptively speaking, the lever arm for applying a force to the component for breaking the mounted component off the carrier can be rendered significantly smaller when the component is mounted at least partially within the accommodation through hole and hence at carrier level rather than mounting it above. Also, the mounting architecture of mounting the component within the accommodation through hole allows for a more symmetric arrangement of the package in a vertical direction which also contributes to an improvement of the mechanical stability and therefore the reliability of the package.

In particular when combining the component in the carrier connected via the connection structure with an electronic chip mounted also on the same carrier, it can be ensured that the entire package, in particular after an encapsulation procedure, becomes too thick so that the (for instance magnetic sensor) chip becomes too far away from a surface of the package. Thereby, removing the vertical thickness of the component portion of the package may also have a highly advantageous impact on the reduction of a height of a (in particular magnetic sensor) chip region of the package.

In the following, further exemplary embodiments of the packages and the method will be explained.

In the context of the present application, the term "accommodation recess" may particularly denote a groove, a blind hole, a lateral indentation or even a through-hole (i.e. an accommodation through hole) defined in the carrier and serving as a volume in which the component or part thereof can be accommodated or received. Such an accommodation through hole may be located at carrier level.

In the context of the present application, the term "component" may particularly denote any electronic member which can be connected to a carrier to provide its electronic function for the package. In particular, the component may be a passive component such as a capacitor, an ohmic resistance, an inductance, etc. It is however also possible in other applications that the component is an active electronic component, such as an electronic chip, in particular a semiconductor chip.

In an embodiment, the connection structure is electrically conductive. Therefore, the connection structure may not only provide a mechanical connection between the component and the carrier, but may simultaneously also form an electric connection between carrier and component. In the latter mentioned embodiment, the carrier and the component may both be at least partially electrically conductive. For example, it is possible that the connection structure comprises a first portion electrically connecting a first portion of the carrier with a first terminal of the component and comprises a separate second portion connecting a second portion of the carrier with a second terminal of the component. In such an embodiment, a highly symmetric configuration with a reliable mechanical connection and at the same time the formation of two different electrically conductive connections can be obtained.

In an embodiment, the connection structure comprises one of the group consisting of glue, solder, a bond wire, a bond ribbon, a clip, an adhesive film, and a further component (in particular a surface mounted device component, more particularly an ohmic resistor or a ceramic capacitor). When the connection structure is configured as a glue, the glue is preferably electrically conductive. For instance, such an electrically conductive glue may be formed by a gluing constituent (which may be electrically insulating, for instance on the basis of epoxy) providing an adhesion function and may comprise electrically conductive particles (such as silver particles) for providing the electric conductivity which can be used for not only mechanically but also electrically connecting the component with the carrier. It is however alternatively also possible that the entire glue is made of an electrically conductive material. Using a glue as connection structure has turned out to be appropriate, since the provision of a droplet of the glue to the component placed in the accommodation through hole may be sufficient for establishing the connection by the glue-based connection structure, since the glue will flow into the accommodation through hole due to capillary forces and will establish a symmetric connection between carrier and component. However, it may be also preferred to embody the connection structure from a solder material. In such an embodiment it may be sufficient to apply a certain amount of the solder material (for instance a solder paste) to an interface between the component in the accommodation through hole and the carrier and to start a reflow procedure. The latter can be accomplished by supplying thermal heat, preferably in a vacuum atmosphere. Due to capillary forces, the solder undergoing the reflow procedure will then flow into the accommodation through hole and will form an intimate connection between carrier and component. When embodied as a bond wire or bond ribbon, the connection structure may fulfil a purely electric connection function. A mechanical connection function may then be fulfilled by a glue and/or an encapsulant. A further component (such as a surface mounted device which may be embodied for instance as a resistor or a capacitor) serving as connection structure between carrier and component (for instance an electronic chip) may allow manufacturing a compact package with sophisticated electronic functionality.

In an embodiment, the connection structure is arranged partially or fully within the accommodation through hole. In another embodiment, the connection structure is arranged partially or completely outside of the accommodation through hole. Combinations of the mentioned embodiments are possible.

In an embodiment, the carrier is a leadframe. For example, such a leadframe may be a patterned planar metal plate, wherein through-holes or void portions of the leadframe may form the accommodation through hole. The provision of such a planar and fully electrically conductive carrier keeps the manufactured package very compact in the vertical direction. For instance, such a leadframe may be made of copper.

In another embodiment, the carrier is a printed circuit board (PCB). Such a PCB may have an accommodation through hole in which the component may be accommodated. Copper traces of the PCB may accomplish the electric connection and FR4 material (i.e. resin with reinforcing glass cloth) of the PCB may provide the mechanical connection of the component.

Alternative carriers which may be used for other embodiments can be any interposer like a substrate, a ceramic substrate, a laminar substrate, or an IMS (Insulated Metal Substrate), etc.

In an embodiment, the package comprises an encapsulant encapsulating the component, the connection structure and part of the carrier. Providing such an encapsulant mechanically protects the component and the connection structure against a mechanical impact from an environment and also provides an electric insulation. When the component is mounted at carrier level and hence within the accommodation through hole, the package remains vertically compact even after being encapsulated by an encapsulant.

An electronic chip, which may be optionally provided at the package in addition to the component, may be encapsulated by an encapsulant such as a mold compound as well. In one corresponding embodiment, one common continuous mold structure or encapsulant may be used for encapsulating both the component and the electronic chip. In another embodiment, two separate mold structures may be formed for electronic chip and component. In either alternative, it is however possible to render the entire package compact in a vertical direction which allows to bring the electronic chip close to a surface of the package. When the electronic chip is embodied as a magnetic sensor chip (for instance a magnetic Hall sensor chip), the distance between the sensor active region of the electronic chip and the surface of the package significantly matters what concerns magnetic sensitivity. Therefore, the highly compact design thanks to the positioning of the component at carrier level rather than mounting it above carrier level allows to render the magnetic sensor package highly sensitive.

In an embodiment, the encapsulant comprises at least one of the group consisting of a mold compound (for instance an overmolding mold compound or a glob top) and a laminate. In a preferred embodiment, the encapsulant is a mold compound. For the encapsulating by molding, a plastic material or a ceramic material may be used. The encapsulant may comprise an epoxy material. Filler particles (for instance SiO2, Al2O3, Si3N4, BN, AlN, diamond, etc.), for instance for improving thermal conductivity, may be embedded in an epoxy-based matrix of the encapsulant.

In an embodiment, the package comprises an electronic chip mounted on the carrier. For instance, the mentioned electronic chip may be surface-mounted on the carrier, for example by a solder connection or by an electrically conductive glue. The electronic chip may electronically cooperate with the component. For instance, the electronic chip (or the component) and be a sensor chip (in particular the above-mentioned magnetic sensor chip) cooperating with a ceramic capacitor as component. In such an embodiment, the magnetic sensor signal generated by the magnetic sensor chip can be smoothened by the capacitor component. However, other embodiments are possible for electronic chip and cooperating component.

In an embodiment, the component and the electronic chip are mounted laterally spaced at different sections of the carrier. In such an embodiment, the electronic chip and the component are mounted juxtaposed in different surface portions of the carrier. The reduced height requirement of the component mounted on carrier level also translates into a highly compact configuration of the chip portion of the package, in particular when both component portion and chip portion are encapsulated by one and the same encapsulant. The electronic chip may then be placed significantly closer to an exterior surface of the package which may be advantageous in terms of an improved sensitivity of a sensor chip, an improved removal of heat from the chip generated during operation, etc.

In another embodiment, the component and the electronic chip are mounted at at least overlapping sections of the carrier. In such an embodiment, it is in particular possible that the electronic chip is mounted on a surface portion of the carrier which fully encompasses or encloses the surface portion of the carrier within which the component may be mounted. Since the component is not mounted on, but in the carrier, it becomes possible that the electronic chip is mounted at least partially in the same surface portion where the component is mounted. This further reduces the volume of the package, since it increases compactness in a lateral direction. The dimension of the carrier may be significantly reduced. Furthermore, the amount of encapsulant material needed for encapsulating both component and electronic chip may be significantly reduced by taking such a measure.

In an embodiment, the electronic chip is a sensor chip, in particular a magnetic sensor chip. In such an embodiment, the sensor chip may sense a sensing signal and may generate a corresponding electric signal. The latter may be received by the component, for instance may be smoothened by a capacitor type component. In the mentioned example of a magnetic sensor chip, the magnetic sensor chip may for instance be of the Hall sensor type capable of detecting a magnetic field in an environment of the package. For instance, such a magnetic sensor chip may be implemented in an automotive application, for instance for sensing a crankshaft or cam shaft of an engine. In particular for such automotive applications, an extremely high accuracy of the package is required, so that the pronounced reduction of package dimensions is specifically advantageous for such an application.

In an embodiment, a first portion of the component protrudes beyond a first main surface of the carrier and another second portion of the component protrudes beyond an opposing second main surface of the carrier. By taking this measure, the thickness of the package may be reduced at least by the thickness of the carrier, since in this embodiment, the component protrudes beyond both opposing main surfaces of the (in particular planar or plate-shaped) carrier. Thus, the first portion protrudes beyond the first main surface of the carrier, the second portion protrudes beyond the opposing second main surface of the carrier, and an intermediate third portion of the component is placed entirely within the accommodation through hole.

In an embodiment, the first portion and the second portion of the component are arranged mirror symmetrically with respect to an extension plane of the carrier. By such a symmetric configuration in which the thickness of the first portion equals to the thickness of the second portion, a mechanically particularly stable and highly compact package may be obtained. A symmetric configuration of the two portions with regard to the carrier (plate) as mirror axis or mirror plane translates into low mechanical tensions within the package and therefore a reliable operation.

In an embodiment, a first portion of the connection structure protrudes beyond a first main surface of the carrier and another second portion of the connection structure protrudes beyond an opposing second main surface of the carrier. Thus, the connection structure may comprise two fillets on two opposing main surfaces of the carrier. This further promotes the high degree of symmetry of the package and results in a very reliable connection between carrier and component. Advantageously, the symmetric arrangement of the two fillets of the connection structure can be manufactured benefiting from a self-alignment process, because effects such as capillary forces may promote the formation of such a symmetric configuration of the connection structure.

In an embodiment, the first portion and the second portion of the connection structure are arranged mirror symmetrically with respect to an extension plane of the carrier. When the two portions of the connection structure on the two opposing main surfaces of the carrier (plate) are configured to be symmetric, a particularly stable and secure connection between component and carrier may be obtained.

In an embodiment, the connection structure comprises two separate connection bodies both being substantially C-shaped in a cross-sectional view. Each of the two connection bodies may couple a respective portion of the carrier with a respective terminal of the component. The C-shape of the two separate connection bodies ensures that the respective C-shaped connection body engages a significant edge portion of the carrier and thereby provides a large connection surface to the component.

In an embodiment, the component is a surface mounted device (SMD) component. By embodying the component as SMD component, the paradigm of surface mounting surface mounted devices may be inverted by an exemplary embodiment by mounting such a surface mounted device not on a surface but partially or entirely in an interior of the carrier. This results in a mechanically stable and compact configuration.

However, the component may also be an electronic chip. Thus, also a semiconductor chip may be mounted at carrier level and thus in an accommodation volume of the carrier or side by side with the carrier. In other words, the component may also be located besides the carrier.

In an embodiment, the component is floatingly (i.e. not completely immobilized by the carrier) located within the package. It may in particular be floatingly located within an encapsulant, and may be located and mechanically stabilized apart from the carrier.

In an embodiment, a lower main surface of the component neither contacts the carrier nor the connection structure. In such an embodiment, the upper main surface and/or one or more side edges of the component may be used for establishing an electric connection with the carrier.

In an embodiment, the component is located at a vertical level of the carrier. For instance, a vertical center of gravity of the component may (in particular substantially or exactly) correspond to a vertical center of gravity of the carrier.

In an embodiment, at least one of a front end side and a back end side of the component is out of contact with the carrier. In an embodiment, the carrier comprises an electric connection section (for instance carrier fingers of the carrier cooperating with side portions of the component) electrically connecting the component via the connection structure (such as bond wires), and comprises a mechanical supporting section (for instance alignment rips in edge portions of a frame portion of the carrier cooperating with edge portions of the component) supporting the component via at least one adhesive dot for fixing a position of the component. Thus, the tasks of electrically connecting and mechanically connecting the component by the carrier may also be spatially or structurally separated and assigned to different carrier portions. Such an embodiment is shown in FIG. 18.

Figure 19:
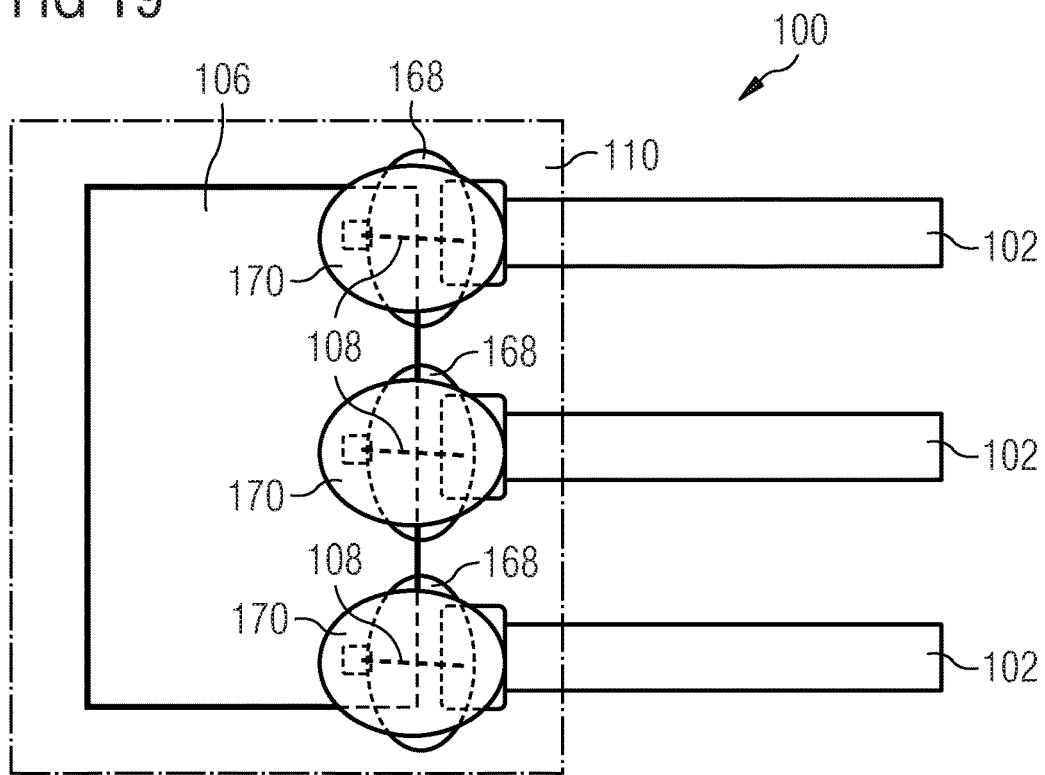

In an embodiment, the package comprises a mechanical fixing structure (such as one or more glue dots at one main surface of the component) for mechanically fixing the component at the carrier, and comprises a protecting surrounding structure (such as one or more glob top sections at another main surface of the component) surrounding or encapsulating the connection structure at an interface between the carrier and the component. Such an embodiment is shown in FIG. 19.

Figure 20:
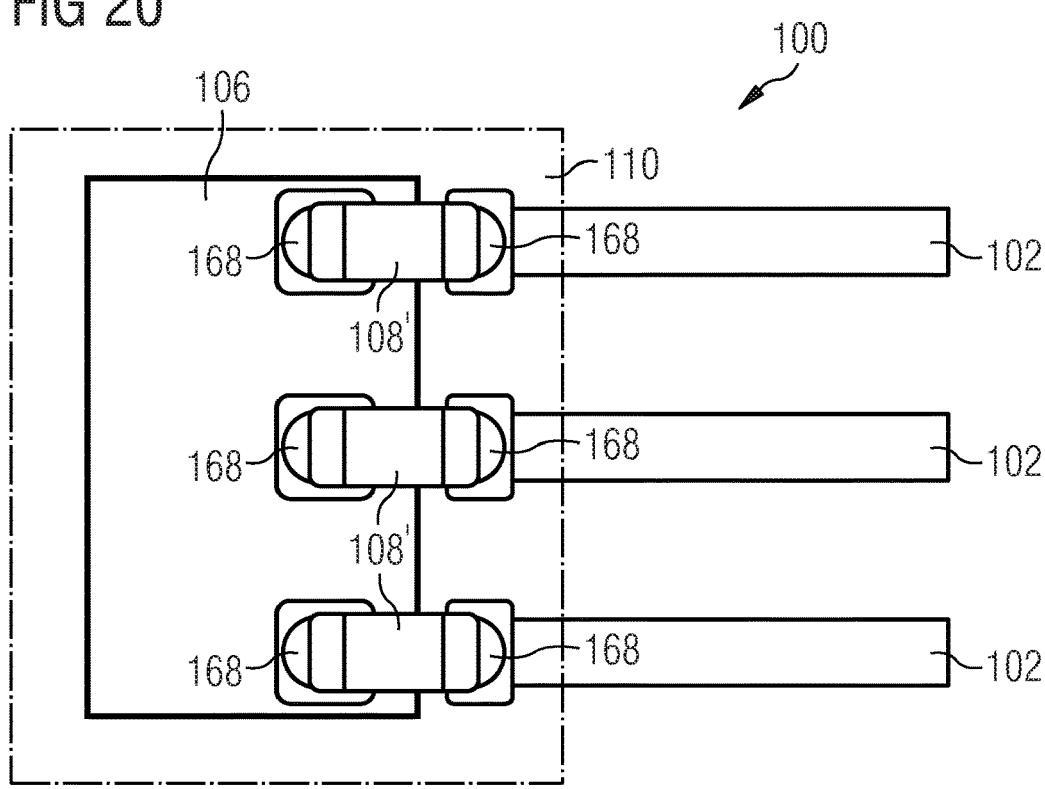

In an embodiment, the connection structure is configured as a further electronic component having a first terminal electrically contacting the component and having a second terminal electrically contacting the carrier. In such an embodiment, an SMD component may bridge the component with regard to the carrier to thereby obtain a highly compact package with high degree of electric functionality. Such an embodiment is shown in FIG. 20.

Figure 21:
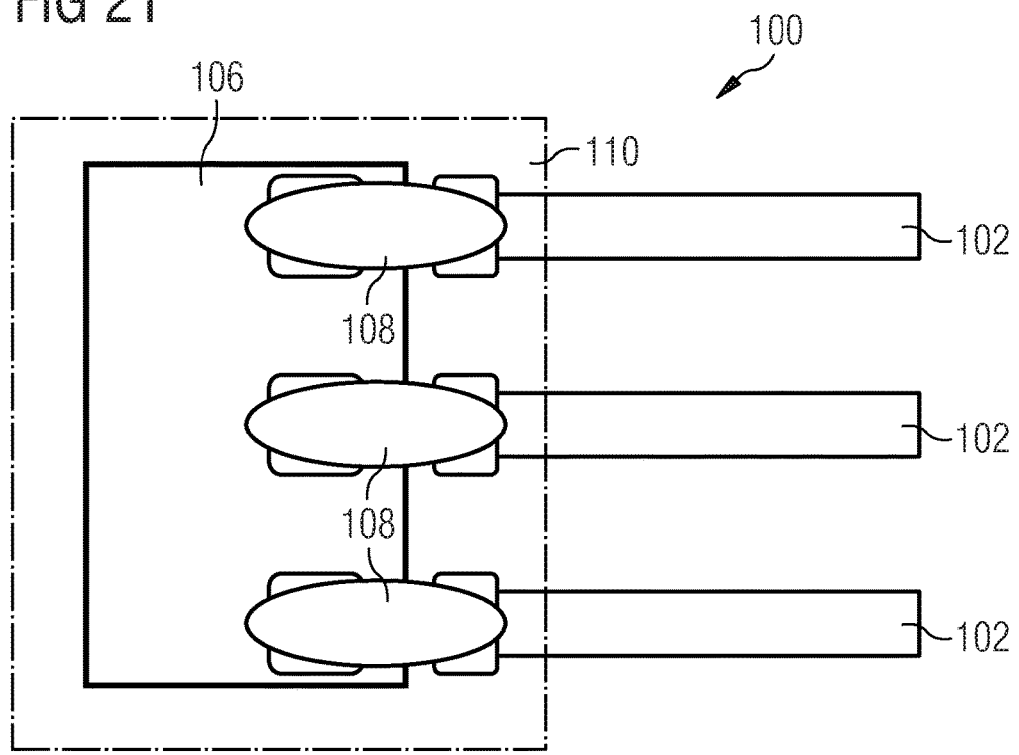

In an embodiment, the connection structure is configured for electrically and mechanically connecting the component with the carrier. In such an embodiment, the functions of electrically and mechanically connecting the carrier with the component may be combined in a single connection structure to obtain a small-size package. Such an embodiment is shown in FIG. 21.

Figure 22:
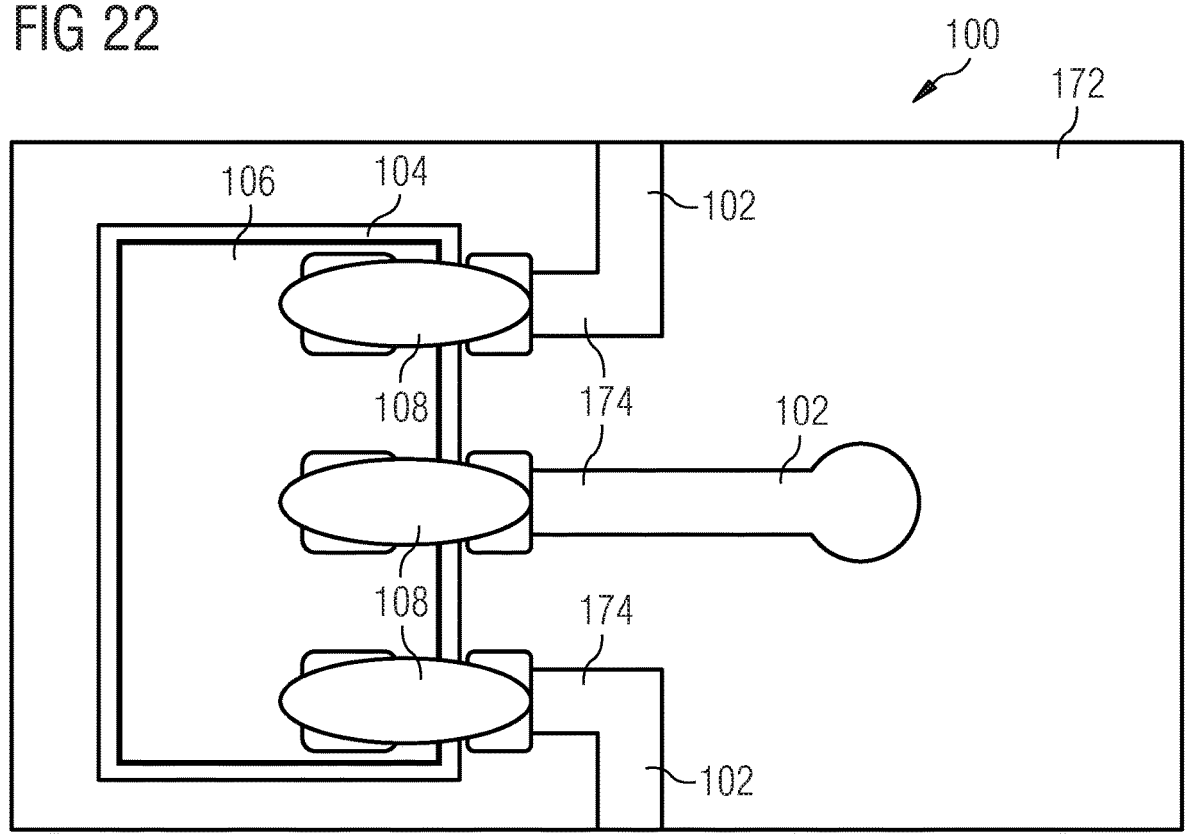

In an embodiment, the carrier comprises an electrically insulating support plate (for instance comprising resin with reinforcing particles) defining an accommodation through hole in which the component is accommodated, and comprises electrically conductive traces (such as copper structures) on the support plate and being electrically connected with the component via the connection structure. The support plate may form the dielectric part of a printed circuit board, whereas the traces may for the metallic part of the printed circuit board. Such an embodiment is shown in FIG. 22.

In an embodiment, the carrier (partially or entirely) and/or the connection structure (partially or entirely) is or are formed by additive manufacturing, in particular by three-dimensionally printing. For instance, a powder material (such as a metallic powder) may be provided which may be locally and selectively cured or hardened by a thermal treatment such as a laser treatment. By taking this measure, any three-dimensional carrier structure and/or connection structure may be formed by 3D printing. The carrier structure and the connection structure may also be integrally formed by additive manufacturing, in particular three dimensionally printing.

In an embodiment, the method comprises placing the component into the accommodation through hole so that one portion protrudes beyond one main surface of the carrier and another portion protrudes beyond another main surface of the carrier, dispensing material of the connection structure between the carrier and the component on one of the portions, and triggering reflow of the dispensed material so that the material flows partially to the other one of the portions. Thus, the package can be formed with a simple reflow soldering procedure.

In an embodiment, the method comprises providing a support structure with a cavity and arranging the component in the cavity and the carrier outside of the cavity before forming the connection structure. Such manufacture of the packages can be accomplished by providing a cavity line along which a plurality of components may be placed. This may be followed by a formation of a solder or glue connection in a batch process. As a result, an efficient manufacture with a high throughput becomes possible.

In an embodiment, the method further comprises manufacturing a system in package using the above-described package as a constituent or part of the system in package. Correspondingly, the package may be configured as a system in package (SiP) or part thereof. Such a system in package may use a package of the above-described type with an encapsulated component on a carrier for forming a larger system with additional electronic functionality. Such a system in package may hence be packaged in a larger packaging casing or encapsulation. A system in package may be thus composed of a number of integrated circuits enclosed in a single module or package. The SiP may perform multiple electronic functions, and may for instance be used inside a mobile phone, etc. Dies containing integrated circuits may be stacked vertically on a carrier and may be internally electrically connected. An example SiP can contain several chips (such as a specialized processor, a memory, etc.) combined with passive components such as one or more resistors and/or capacitors which may all be mounted on the same carrier.

In an embodiment, the package is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the package according to an exemplary embodiment is fully compatible with standard packaging concepts (in particular fully compatible with standard TO packaging concepts) and appears externally as a conventional electronic component, which is highly user-convenient. In an embodiment, the package is configured as power module, e.g. molded power module. For instance, an exemplary embodiment of the electronic component may be an intelligent power module (IPM).

In a preferred embodiment, the component or the electronic chip is configured as a controller chip, a processor chip, a memory chip, a sensor chip or a micro-electromechanical system (MEMS). In an alternative embodiment, it is also possible that the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology. A semiconductor device according to an exemplary embodiment may be configured as micro-electromechanical system (MEMS), sensor, etc.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

The illustration in the drawing is schematically.

Before describing further exemplary embodiments in further detail, some basic considerations of the present inventors will be summarized based on which exemplary embodiments have been developed.

According to exemplary embodiments of a first aspect of the invention, embedding an SMD (surface mounted device) component at carrier level may be performed for forming a mold package (see in particular FIG. 1 to FIG. 15).

In particular, a robust SMD solder process is provided in combination with small package dimension and low package costs to enable integrated circuit packages like SiP packages or especially magnet sensors. The latter may include, in the same mold housing, an electronic chip (such as a silicon die) and also a component (such as an SMD component). A corresponding SMD bond architecture may involve a connection process which may be embodied as a solder or conductive glue process. More particularly, a corresponding package may be formed by implementing a C-profile SMD component attach process within a carrier (in particular leadframe) layer level. Advantageously, such an architecture results in a highly compact package with small height. This, in turn, has the consequence of a reduced airgap and an improved performance of the package, in particular when embodied as a magnet sensor package.

In particular, a mechanically highly robust interconnection between carrier and component may be achieved due to a long solder or glue line between carrier (in particular leadframe) and component (in particular SMD part). Additionally, such a manufacturing method allows providing two connection structure (in particular solder) fillets (above and below the carrier) for significantly increasing mechanical stability of the package. As an additional mechanical advantage, the described approach makes it possible to obtain a high symmetry by manufacturing a package stack in which the component is at the same height level as the carrier. This increases the stability against bending, pulling or other mechanical stress exerted during an assembly process or molding the package. Delamination issues may be prevented, so as to meet the strict requirements for automotive or other sensor applications.

Reduced package height due to the use of SMD components can get leveled down into or even below carrier level. For instance, a carrier thickness and a connection structure thickness (in particular a glue/solder bond line thickness can be removed from package height. For instance, this can be highly advantageous for applications in magnet sensing for obtaining a reduced airgap (i.e. a reduced reading distance between a sensor in an ASIC chip to a magnetic element to be sensed). This, in turn, promotes a significant increase in sensor performance. Also the package size in a horizontal plane may be reduced, since a smaller solder or glue pad on the carrier may be sufficient. Especially for a solder process, no solder resist may be required any more, since a capillary effect may absorb the solder for obtaining a C-profile of the connection structure around the SMD component between the carrier and the SMD component to fill the gap in between and to form two fillets above and below the carrier to the SMD component.

Furthermore, a reduction of the manufacturing effort for manufacturing the package becomes possible by features of the manufacturing process (such as component attach on chip backside within leadframe opening). In an embodiment, a separate housing for a ceramic capacitor component becomes dispensable by the described manufacturing architecture.

Moreover, the reliability behavior of the package due to the described SMD attach process may be improved. In particular, an increased clearance between the terminals of the component reduces the risk for undesired migration effects (descriptively speaking, the clearance may be the same to the component terminal distance, and not reduced by any glue fillet below the component to the carrier, which is an issue for a conventional manufacturing process). Beyond this, any tendency of delamination can be suppressed and increased SMD shear values may be obtained.

One exemplary embodiment of a method of manufacturing a package may involve the following procedures:

1. Provide a carrier, for instance a leadframe
2. Place an SMD component into carrier positions with negative offset (i.e. inside the carrier level height). This can be done by a (for instance 400 μm deep) cavity line in a carrier bottom plate or support structure.
3. Connection structure (for instance solder or glue) dispensing to terminals of the component.
4. Cure connection structure (for instance by solder reflow or glue cure process)
5. Encapsulation (for instance overmolding or lamination of package, into which an integrated circuit may be also already mounted).

Another exemplary embodiment of a method of manufacturing a package may involve the following procedure:

1. Provide a carrier, for instance a leadframe
2. Attach electronic chip or die (for instance by glue dispensing, die pick and place and wire bonding)
3. Flip the carrier so that the electronic chip faces down 4. Place and attach SMD component on the backside of the electronic chip in an accommodation through hole or opening of the carrier 5. Apply material for forming the connection structure (such as conductive glue or solder)

6. Cure connection structure (for instance by solder reflow or glue cure process)

7. Encapsulation (for instance overmolding or lamination of package) to finish package (SiP module)

In an embodiment, a package architecture for manufacturing a multi-chip package and an SMD stack onto chip inside carrier level for miniaturized package size is provided. For instance, a package may be manufactured by stacking an SMD component and a stacked carrier on an electronic chip (such as a silicon die) without the need to perform wire bonding. This allows manufacturing a package with significantly reduced package dimensions in a plane vertical to a stacking direction.

In an embodiment, it is possible to perform reflow soldering of a die to a carrier for manufacturing a leadless package (if desired with a flip chip process). This can be done together with the mounting of an SMD part into an integrated circuit housing. Optionally, a corresponding process flow may involve stack soldering (for instance, an SMD component and a carrier may be soldered on top of an electronic chip, which may for instance be placed on a vacuum plate.

With a manufacturing method according to an exemplary embodiment, it is for instance possible to provide a compact magnetic sensor package with high sensing accuracy. With such an architecture, it is possible to obtain a high package robustness (in particular, a solder fillet may be increased significantly in area and volume, which may enable to assembly sensors with soldered ceramic capacitors in a reel-to-reel line). Moreover, it is possible to obtain an increased product performance with a small package outline (for instance for package height reduction). Beyond this, a more compact package may be manufactured with reduced costs (in particular, an SMD housing for components such as ceramic capacitor components can be dispensable, and it may be possible to achieve smaller module or package dimensions).

In an embodiment, an SMD embedding architecture is provided implementing a C-profile soldering of SMD components into an integrated circuit (IC) package, an SiP package, or a laminate package, wherein the component is positioned within the carrier (in particular leadframe) level (rather than on top of leadframe solder pads). Such a concept may allow to achieve robust packages by eliminated or reduced tendency of delamination, reduced package height, and reduced package cost and hence significantly reduced system costs.

Advantageously, simulations have shown a significantly increased mechanical stability, if conventional solder landing pads get replaced by C-profile soldering to leadframe with two fillets with SMD component leveled in the leadframe opening. This may significantly reduce mechanical stress during leadframe bending and stress testing.

Regarding processability, component soldering in carrier level is a straightforward process. A mechanical test was done, showing that an SMD component can be placed into leadframe level (for instance using a slot in the leadframe). It turned out as possible to move the SMD component around by the leadframe in this position without issues.

In particular, such a packaging or assembly architecture is highly advantageous in terms of magnetic sensor packages and allows an elimination of a separate housing of a ceramic capacitor by including the ceramic capacitor (or other SMD component) into an ASIC housing.

Moreover, it is possible to obtain a smaller package outline. In terms of the mentioned example of a magnetic sensor package, such a magnetic sensor can get assembled into a small (for instance no larger than 8 mm diameter) assembly hole in a sensor system by reaching high performance level (in combination with an optional package portion for serial resistors and capacitances). Highly advantageously, package dimensions may be significantly reduced, and the system can be manufactured with low effort.

According to exemplary embodiments of a second aspect of the invention, an integrated circuit (IC) package without mounting an electronic chip on a carrier is provided (see in particular FIG. 16 to FIG. 28).

In particular, it is in this context possible to enable thin packages containing semiconductors and other components. In particular, magnetic sensors may be adapted in order to reduce or even minimize the distance between magnetic sensor cell (i.e. chip surface) and package surface. This may lead to an increase of sensor performance because the airgap between sensor and external magnets can be reduced.

It is also possible with the mentioned architecture to provide a package without carrier (in particular leadframe) and die attach glue on die backside. For instance, it is possible that an electronic chip or die is floating in package (for example in a mold compound), wherein the position may be fixed by various measures, as described below.

Exemplary embodiments allow to eliminate glue and a carrier (for instance leadframe) layer on the front side and/or on the backside of the chip, so that very thin mold packages, and hence an increased IC performance may be obtained.

In particular, exemplary embodiments allow to obtain one or more of the following advantages:
- closer distance of sensor to element to be sensed by reduced package height, when the package is embodied as magnetic sensor package
- reduced stress to electronic chip (since the coefficient of thermal expansion of an encapsulant (for instance a mold compound) may be adjusted to match better to the electronic chip than the coefficient of thermal expansion between carrier (such as a leadframe) and glue)
- reduced or even eliminated eddy current (which is for instance advantageous for magnet sensor applications)

Also in terms of reliability, exemplary embodiments may provide significant improvements:
- delamination between electronic chip, glue and carrier may be efficiently prevented
- tie bars may be suppressed or eliminated to obtain a reduced risk of package cracks or delamination starting from an edge of the package
- a symmetric package stack with reduced package stress can be obtained An attachment of an electronic chip without glue and leadframe die pad in the package may make various new package concepts possible, see the examples given herein. These concepts can be realized with available back end assembly equipment (such as die bonder, wire bonder, etc.). As a result, no special or expensive equipment is required like for other package types. As a result, a mechanically highly robust package may be provided which can be manufactured with low effort. Advantageously, delamination from electronic chip to glue and from glue to carrier is suppressed (since glue and carrier below electronic chip may be removed).

Additionally, carrier and electronic chip may be located in the same height level, which may increase the stability at bending or other mechanical stress from an assembly process or package, since the package obtains a more elastic behavior.

An increased package performance may be obtained by exemplary embodiments, since eddy currents can be suppressed or eliminated, and reading distances may be reduced (for example, a magnetic sensor requires a close distance from sensor ASIC chip to magnetic element to be sensed, when a high accuracy is desired).

Package height and package size in a plane perpendicular to the height direction can be reduced, since the need of a die pad (which may have a thickness of for example approximately 200 µm around the electronic chip for glue clearance) becomes dispensable. Die pad thickness may provide a major package size contribution for small die size packages.

Moreover, the manufacturing effort may be reduced due to a simplified carrier design (in particular, a higher sample size per leadframe may become possible, since there is no need for a die pad and tie bars any more).

The obtainable smaller package size in one, two or three spatial directions may translate into an increased number of packages manufacturable by batch processes (such as overmolding). Some processes can be supported with large process windows (for instance, die attach to carrier can be designed with ±100 µm).

Beyond this, a high reliability may be obtained, since the carrier die pad and glue may be removed below the die. As a consequence, delamination can be safely prevented. The package stack may be manufactured with a high degree of symmetry, which additionally suppresses any tendency of delamination.

In an embodiment, an integrated circuit package may be provided without die attach glue and without carrier below the electronic chip. This may enable manufacture of robust packages with small package height, and small effort for manufacturing package and system.

In an embodiment, the electronic chip may be positioned roughly at the same height level as the carrier. Preferably, no direct carrier connection to the back side and/or the front side of the electronic chip may occur.

Some advantageous embodiments and features will be described in the following:
 Fixing of electronic chip using glue, solder or three-dimensional metal printing
 Fixing of electronic chip using an SMD component as connection structure The latter mentioned embodiments of the package may use following assembly flow for implementation in a sensor package:
 Provide a support structure (such as a sticky foil, a carrier plate with vacuum holes, a glass plate with sticky layer, etc.)
 Place a carrier (such as a leadframe) onto the support structure (the carrier gets aligned by fixture with alignment pins and/or by glue, sticky foil, vacuum)
 Pick and place the electronic chip onto the mentioned support structure besides fingers of the carrier
 Wire bonding from electronic chip to electrically conductive fingers
 Freeze position of electronic chip, for instance by glue dispensing to an edge of the electronic chip to the carrier with glue curing
 Encapsulation (for instance overmolding)
 Singularization and test Other process examples, which are described below in further detail, are based on freezing the position of the electronic chip to carrier fingers by using glue on the front side and/or the back side of the electronic chip and/or the carrier:
 In one embodiment, the electronic chip and the carrier may be placed into glue material, followed by a curing of the glue material, a wire bonding, and a glob top process to further increase mechanical stability from electronic chip to carrier and to protect the bond wire. Then, an encapsulation (such as an overmolding) may be carried out
 In another embodiment, an adhesive foil may be used to freeze the position of the electronic chip and the carrier, including an encapsulation (for instance mold) process
 In still another embodiment, a discrete (for instance SMD) component or a clip is used to freeze the electronic chip to a carrier position, for instance by a glue or solder process
 In yet another embodiment, a conductive glue may be dispensed to freeze the electronic chip to a carrier position during encapsulation (for instance overmolding), and the electrical bonding from electronic chip to carrier may be formed within same process.

FIG. 1 shows a cross-sectional view of a package 100 according to an exemplary embodiment.

The package 100 comprises an electrically conductive leadframe-type plate-shaped carrier 102 which here consists for example of copper and has an accommodation through hole 104. A component 106, here embodied as an SMD (surface mounted device) is mounted partially above, partially below and partially on carrier level and within the accommodation through hole 104. The component 106 may be a ceramic capacitor. An electrically conductive connection structure 108 (in the shown embodiment an electrically conductive glue or a solder) electrically connects the carrier 102 with the component 106, contributes to mechanically supporting the carrier 102, and is arranged partially within the accommodation through hole 104. Moreover, an encapsulant 110 (which is here embodied as a mold compound) encapsulates the component 106, the connection structure 108 and part of the carrier 102.

More specifically, a first portion 122 of the component 106 protrudes beyond a first main surface 124 of the carrier 102 and another second portion 126 of the component 106 protrudes beyond an opposing second main surface 128 of the carrier 102. The first portion 122 and the second portion 126 of the component 106 are preferably arranged mirror symmetrically with respect to an extension plane 130 of the carrier 102. A first portion 132 of the connection structure 108 protrudes beyond the first main surface 124 of the carrier 102, and another second portion 134 of the connection structure 108 protrudes beyond the opposing second main surface 128 of the carrier 102. The first portion 132 and the second portion 134 of the connection structure 108 are arranged preferably mirror symmetrically with respect to the extension plane 130 of the carrier 102.

Moreover, the connection structure 108 comprises two separate connection bodies 140, 142 each being composed of a corresponding half of the first portion 132 and half of the second portion 134. The configuration of FIG. 1 is symmetrical with regard to a central symmetry axis or the extension plane 130 of the carrier 102 and is also symmetrical with regard to a vertical symmetry axis extending through a center of gravity of the component 106. Due to this high degree of symmetry, internal mechanical load is very small and the package 100 is very robust against mechanical impact and thermal cycles.

Figure 2:
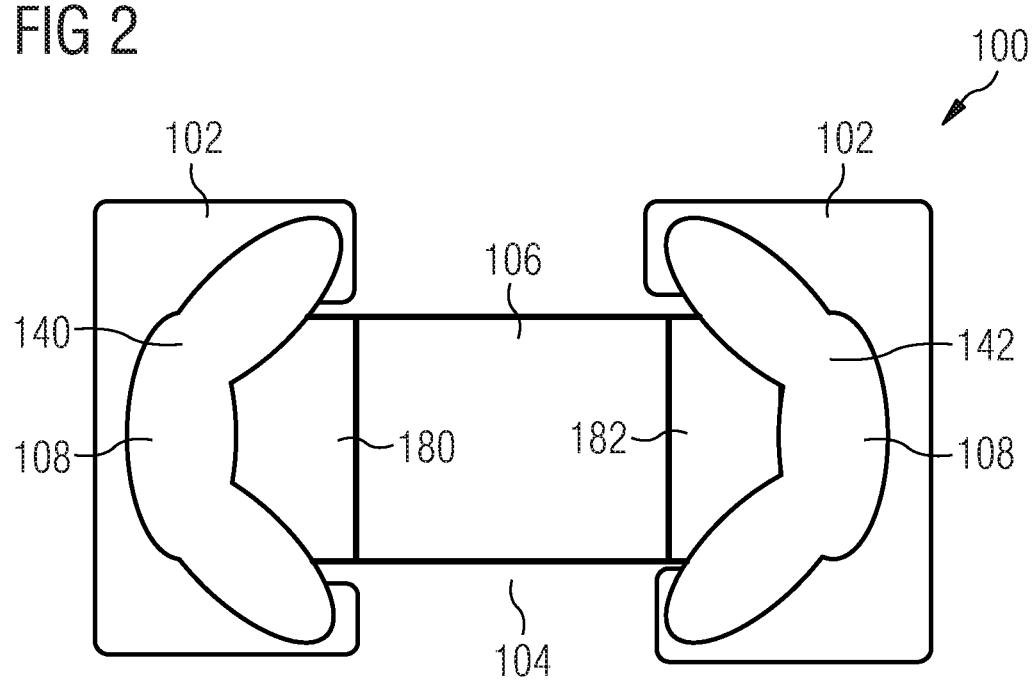
FIG. 2 shows a cross-sectional view of a package according to another exemplary embodiment.

FIG. 2 shows a cross-sectional view of a package 100 according to another exemplary embodiment. The side view of FIG. 2 shows that the solder or glue forming the connection structure 108 encloses or engages terminals 180, 182 of the component 106. As shown in FIG. 2, both separate connection bodies 140, 142 are substantially C-shaped. The C-profile results from a process carried out for manufacturing package 100 according to FIG. 1 or FIG. 2 and securely embeds the component 106 within the leadframe layer level.

Figure 3:
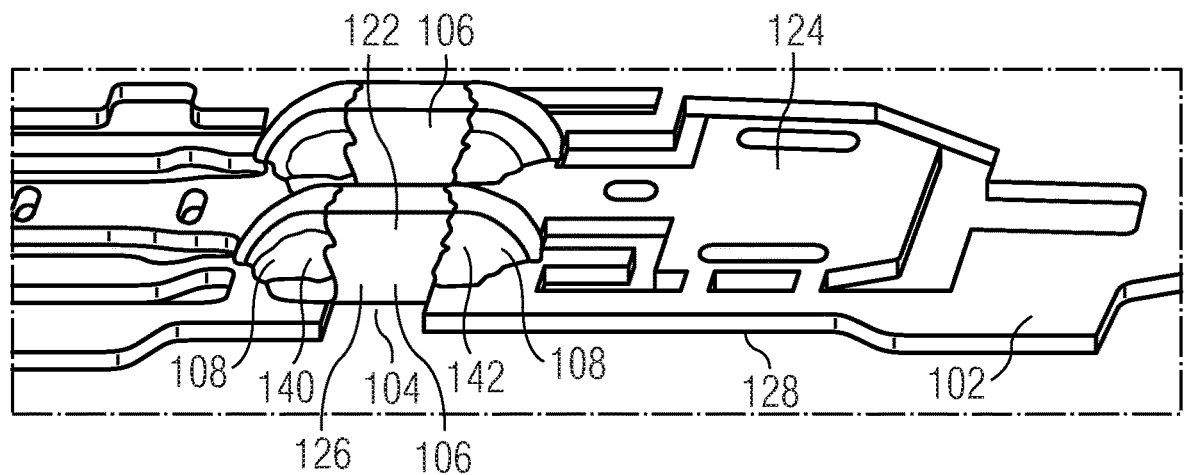
FIG. 3 shows a three-dimensional view of a preform of a package according to another exemplary embodiment.
Figure 4:
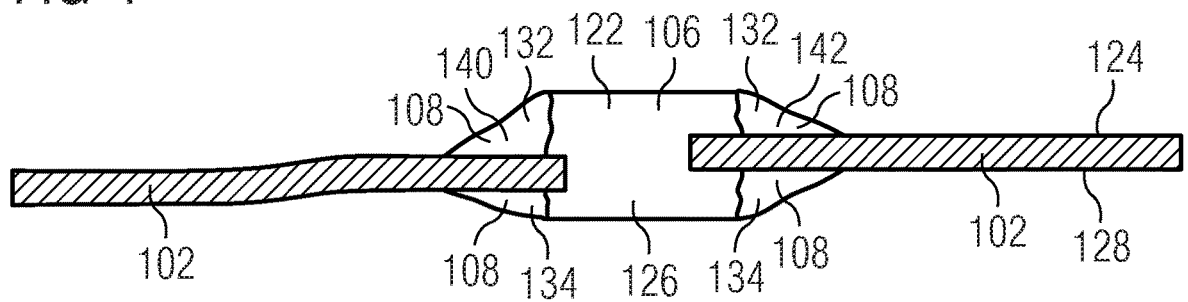
FIG. 4 shows a horizontal view of the preform of FIG. 3.

FIG. 3 shows a three-dimensional view of a preform of a package 100 according to another exemplary embodiment. FIG. 4 shows a horizontal view of the preform of FIG. 3. As can be taken from FIG. 3 and FIG. 4, a significant reduction of the height of the package 100 can be obtained by guiding the component 106 through the accommodation through hole 104. When used for instance for a magnetic sensor system, a reduction of the air gap and optimum performance in particular for magnetic sensors may be achieved.

FIG. 5 shows a cross-sectional view of a conventional package 200 for comparison purposes. A component 202, being molded in an encapsulant 212, is surface-mounted above a carrier 204 by a connection structure 206. On another surface portion of the carrier 204, an electronic chip 208 is mounted by soldering. Since the thickness of the carrier 204 contributes to the height of the package 200, a high volume and weight of the package 200 is obtained. Furthermore, a sensor chip 208 being molded in encapsulant 212 suffers from a large distance between the surface of the package 200 and the sensor active region of the chip 208, so that the package 200 has a relatively low sensitivity.

FIG. 6 shows a cross-sectional view of a package 100 according to an exemplary embodiment.

In addition to the embodiments of FIG. 1 to FIG. 4, the embodiment of FIG. 6 additionally comprises an electronic chip 112, here a magnetic sensor chip capable of sensing the presence of a magnetic body in its environment. The component 106 and the electronic chip 112 are mounted laterally spaced at different sections 114, 116 of the carrier 102. The component 106 is mounted in accommodation through hole 104 of the carrier 102 and thus around carrier level, whereas the electronic chip 112 is mounted on the carrier 102. Both the component 106 and the electronic chip 112 are encapsulated by a common encapsulant 110 according to FIG. 6.

In contrast to FIG. 5, the package 100 according to an exemplary embodiment shown in FIG. 6 has a much more compact design, since the component 106 is mounted at carrier level. In other words, a maximum height of package 200 is D, whereas a maximum height of package 100 is d<D. Thereby, the package height is significantly reduced according to FIG. 6, so that a more compact package 100 and a more sensitive magnetic system can be constructed. Two separate molding procedures for molding electronic chip 112 and for molding component 106 are dispensable according to FIG. 6. The common encapsulation procedure according to FIG. 6 further simplifies the manufacture of the package 100.

The carrier 102 of FIG. 6 may have a thickness, d, of about 200 μm. The electronic chip 112 may for instance have a thickness in a range between 150 μm and 300 μm, for instance 220 μm. The thickness of the component 106 may be in a range between 500 μm and 800 μm.

FIG. 7 to FIG. 11 show cross-sectional views of intermediate structures obtained during carrying out a method of manufacturing a package 100 according to an exemplary embodiment.

Referring to FIG. 7, a plate-shaped leadframe-type carrier 102 is provided with an accommodation through hole 104. Component 106 is arranged partially within the accommodation through hole 104 and is attached with its lower main surface on a support structure 150, for instance a sticky tape. In other words, the component 106 is placed into the accommodation through hole 104 so that one portion 146 protrudes upwardly beyond one main surface 124 of the carrier 102 and another portion 144 protrudes downwardly beyond the other main surface 128 of the carrier 102 and is attached to the support structure 150. FIG. 7 thus shows a front view of component 106 placed within accommodation through hole 104 of carrier 102 and on the support structure 150.

Figure 8:
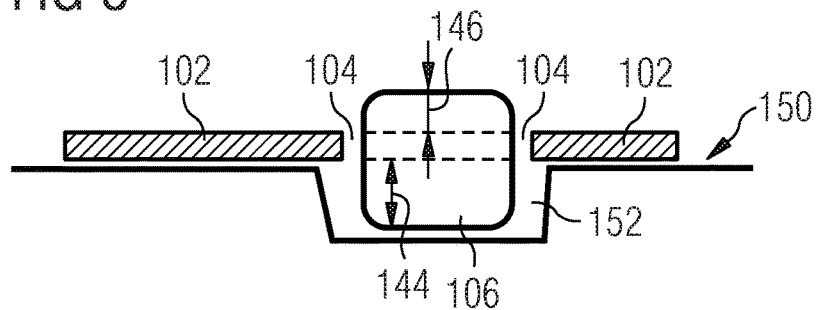

As can be taken from the side view of FIG. 8, the support structure 150 is equipped with a cavity 152 in which the component 106 is inserted. The carrier 102 remains outside of the cavity 152. FIG. 8 shows a side view corresponding to FIG. 7 and also illustrates that the component 106 is placed in cavity 152 of a cavity line which can extend perpendicular to the paper plane of FIG. 8.

Figure 9:
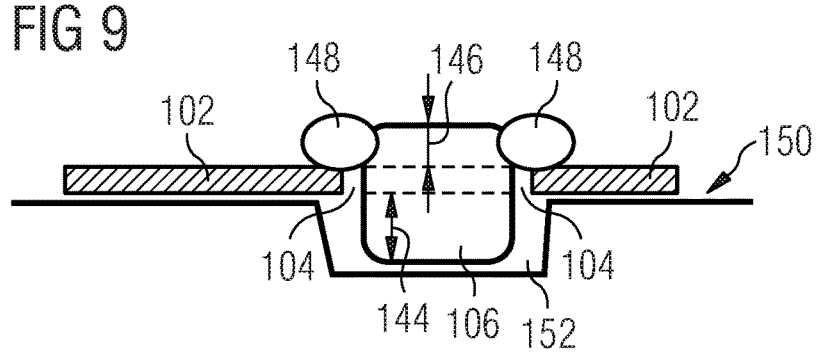

Referring to FIG. 9, a solder material 148 (or alternatively glue) which later forms the connection structure 108 is dispensed between the carrier 102 and the component 106 on portion 146. Subsequently, a reflow process is carried out during which the solder material 148 melts and flows downwardly under the influence of capillary and gravitation forces.

Figure 10:
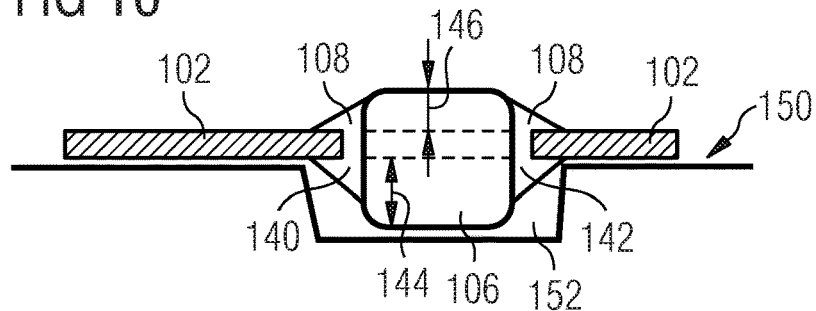

Referring to FIG. 10, formation of the connection structure 108 is completed partially within and possibly outside of the accommodation through hole 104 so as to electrically connect the carrier 102 with the component 106. Thus, reflow of the dispensed solder material 148 may be triggered so that the solder material 148 flows partially towards the other portion 144. FIG. 10 again shows the preform of the package 100 in the side view of FIG. 8.

Figure 11:
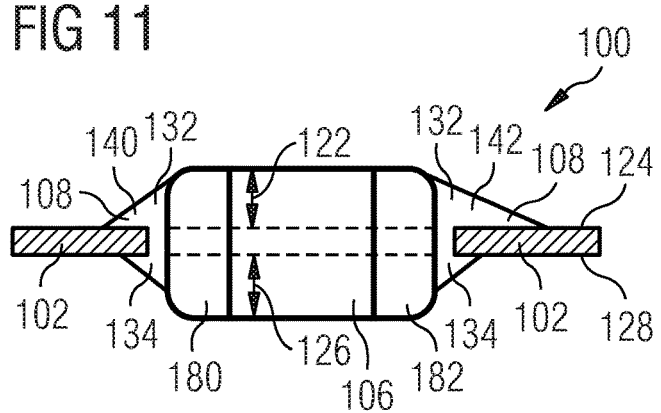

Referring to FIG. 11, a corresponding front view (compare FIG. 7) is shown. The temporary support structure 150 has meanwhile been removed. As can be taken from FIG. 11, the double-C-shape of the connection structure 108 can be formed by the described procedure.

Figure 12:
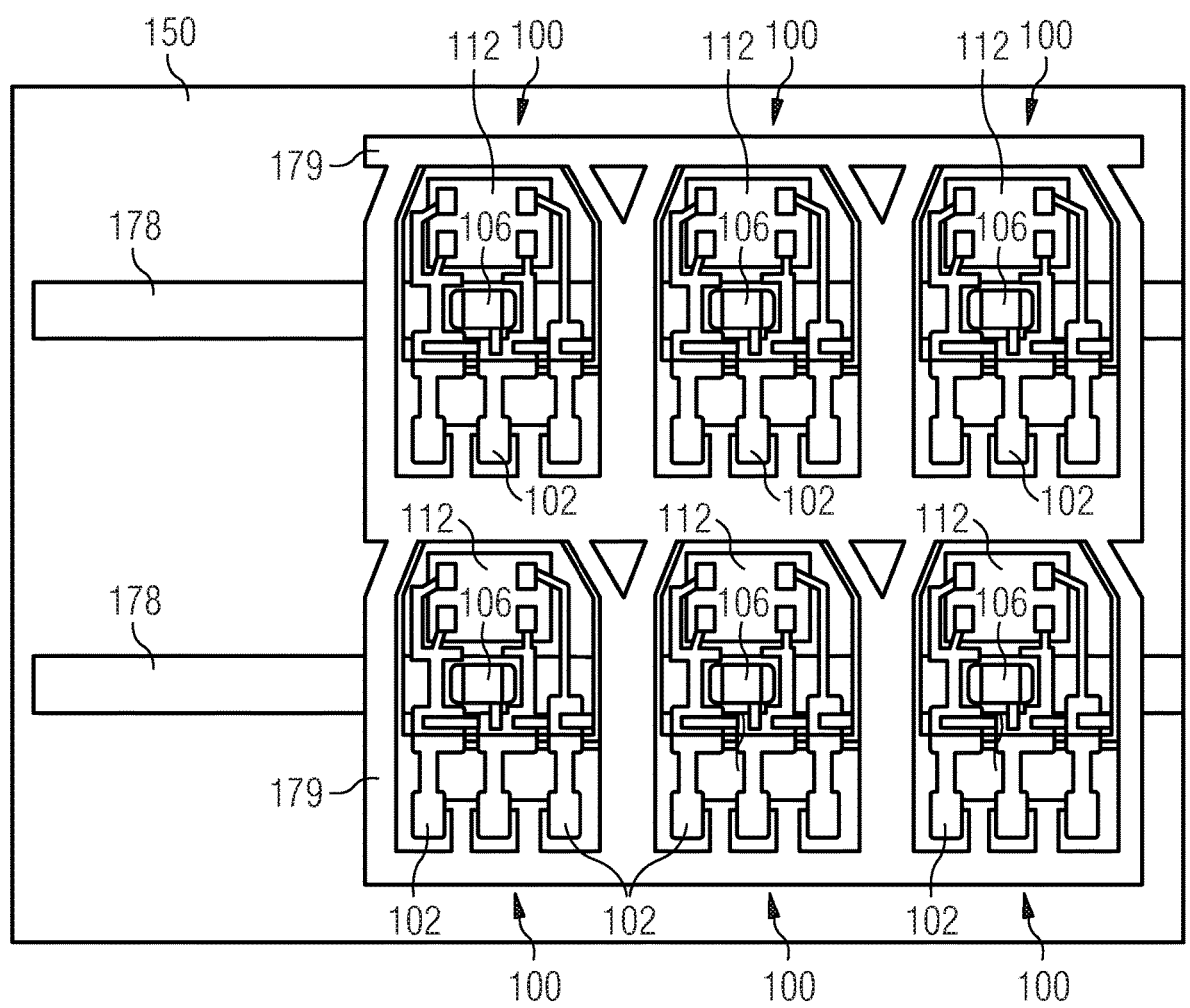
FIG. 12 shows an array of packages manufactured according to an exemplary embodiment.

FIG. 12 shows an array of packages 100 manufactured according to an exemplary embodiment in a batch procedure. FIG. 12 thus shows that a package 100 as the one shown in FIG. 6 can be manufactured efficiently in a batch process. A respective cavity line 178 (see the two parallel lines extending horizontally according to FIG. 12) accommodates multiple portions of components 106 at the same time. A frame portion 179 of the carrier 102 holds all preforms of the packages 100 together prior to singularization (not shown). FIG. 12 also shows a bottom plate as support structure 150 below the leadframe-type carrier 102 with the (for instance 400 μm deep) cavity lines 178.

Figure 13:
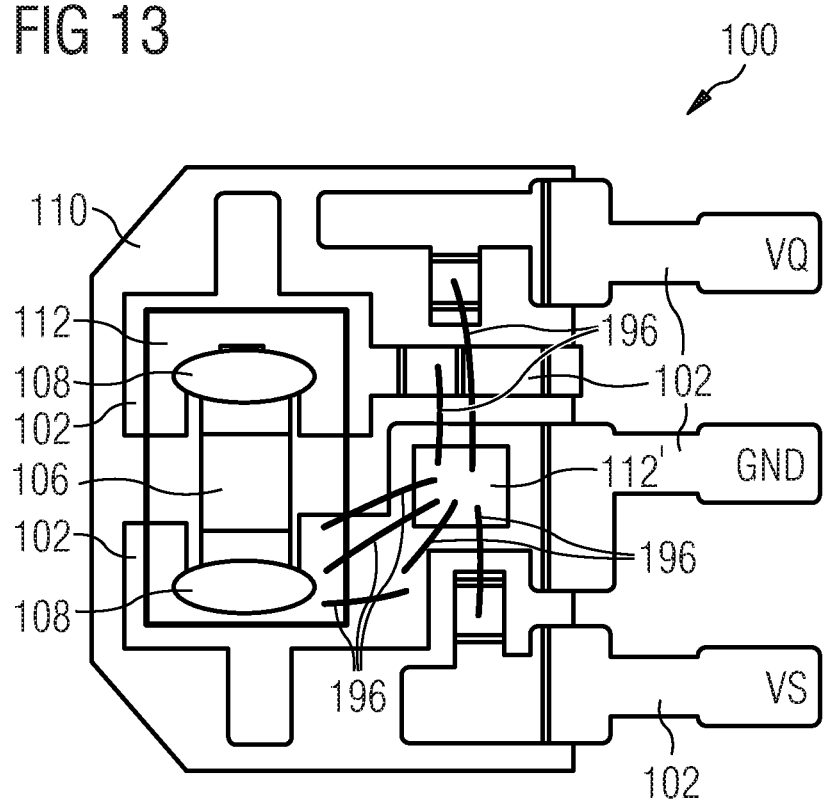
FIG. 13 shows a plan view of a package according to an exemplary embodiment.

FIG. 13 shows a plan view of a package 100 according to an exemplary embodiment. In this embodiment, the electronic chip 112 and the component 106 are mounted in the same region of the carrier 102. Firstly, the electronic chip 112 may be mounted on the carrier 102, for instance by soldering. Subsequently, the obtained structure may be turned around by 180° or flipped. Then, the component 106 may be placed in the accommodation through hole 104 of the carrier 102 and can be electrically and mechanically connected here by gluing or soldering. FIG. 13 shows an additional electronic chip 112' connected by bond wires 196 to the electronic chip 112.

Figure 14:
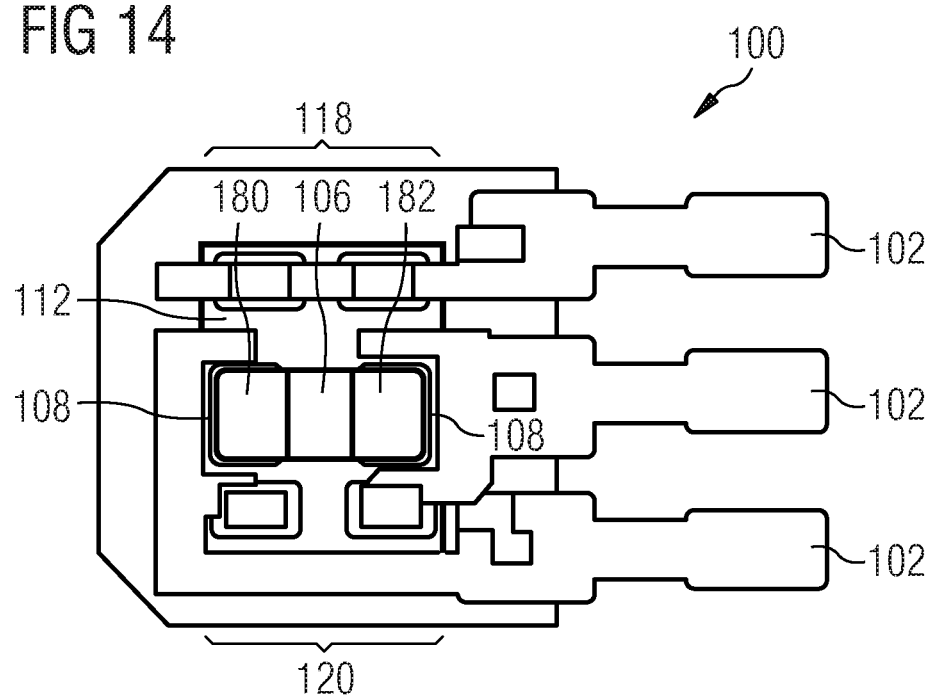
FIG. 14 shows a plan view of a package according to another exemplary embodiment.
Figure 15:
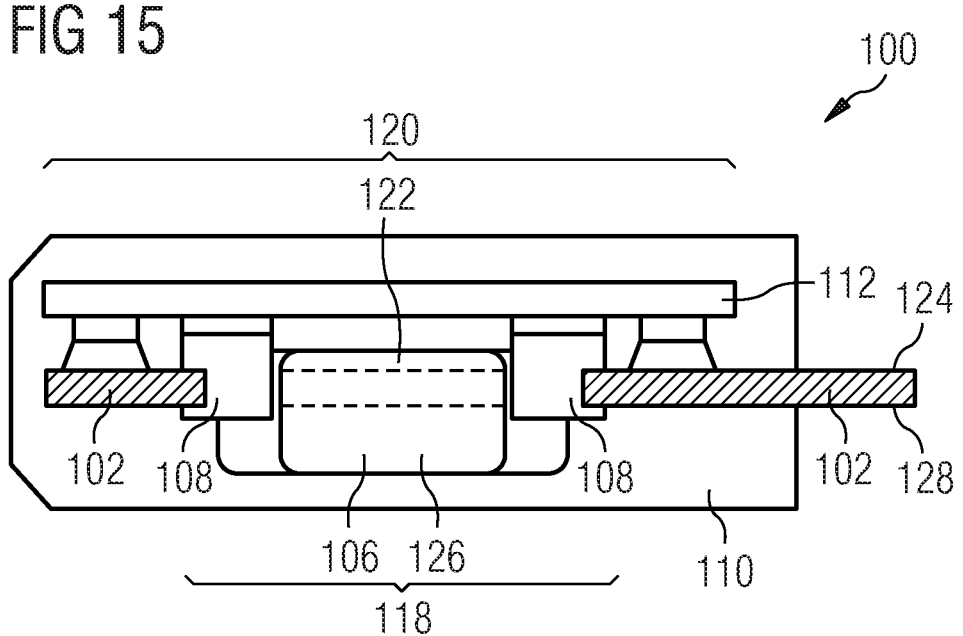
FIG. 15 shows a cross-sectional view of a package according to an exemplary embodiment.

FIG. 14 shows a plan view and FIG. 15 shows a cross-sectional view of a package 100 according to another exemplary embodiment in which again the electronic chip 112 and the component 106 are mounted in the same region of the carrier 102. According to FIG. 14 and FIG. 15, the component 106 and the electronic chip 112 are thus mounted at overlapping sections 118, 120 of the carrier 102. Again, it is possible that the electronic chip 102 is firstly soldered on the carrier 102 followed by a placement of the component 106 in the accommodation through hole 104. Thereafter, a glue or solder connection of the component 106 at carrier level can be carried out, thereby forming connection structure 108. The connection structure 108 can be embodied as a very robust material forming a mechanically and electrically reliable connection between electronic chip 112, carrier 102 and SMD component 106.

Figure 16:
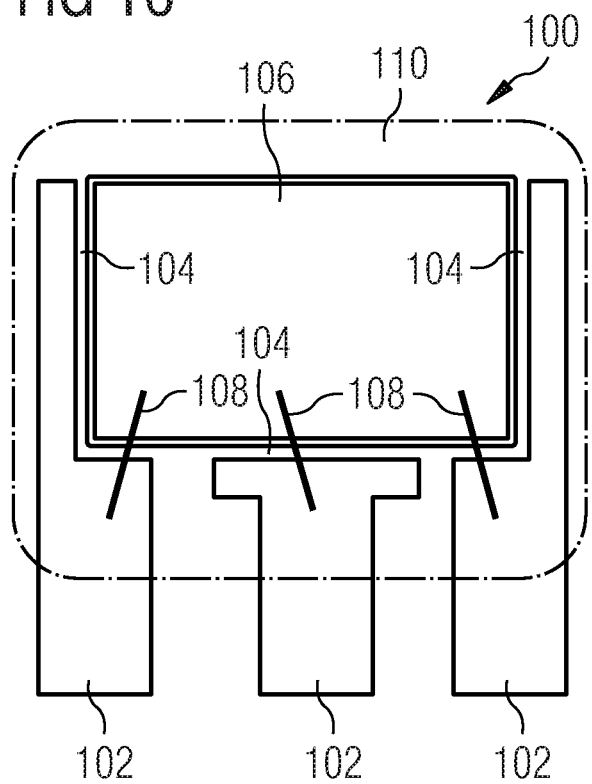
FIG. 16 shows a plan view of a package according to another exemplary embodiment.

FIG. 16 shows a plan view of a package 100 according to another exemplary embodiment. FIG. 17 shows a cross-sectional view of the package 100 according to FIG. 16.

In this embodiment, the component 106 can be an electronic chip rather than an SMD capacitor.

According to the embodiment of FIG. 16 and FIG. 17, the connection structure 108 is arranged completely outside of the accommodation through hole 104. The component 106 is located laterally besides the carrier 102. Moreover, the component 106 is located fully at carrier level, i.e. does not protrude neither in upward direction nor in downward direction beyond the carrier 102. In other words, according to FIG. 16 and FIG. 17, the component 106 is located at a vertical level of the carrier 102. The connection structure 108 is embodied as bond wires according to FIG. 16 and FIG. 17 which electrically connect an upper main surface of the component 106 with an upper main surface of the carrier 102. However, a lower main surface of the component 106 neither contacts the carrier 102 nor the connection structure 108. Beyond this, the component 106 is floatingly located within mold-type encapsulant 110 and apart from the carrier 102. Therefore, the leadframe-type carrier 102 is only located besides the electronic chip forming the component 106 and is not directly connected neither to the back side nor to the front side of the carrier 102.

The concept of the package 100 according to FIG. 16 and FIG. 17 may be further refined: FIG. 18 to FIG. 22 show plan views of packages 100 according to other exemplary embodiments which rely on the basic package concept of FIG. 16 and FIG. 17.

In the embodiment of FIG. 18, the carrier 102 comprises an electric connection section 162 electrically connecting the component 106 via the connection structure 108, and comprises a mechanical supporting section 164 supporting the component 106 via adhesive dots 160 for fixing a position of the component 106. Again, the component 106 is an integrated circuit with bond wires as connection structure 108, floating besides the carrier 102 in an encapsulant 110.

The leadframe type carrier 102 provides alignment rips 166 forming part of the mechanical supporting section 164 and extending inwardly from a frame like portion thereof. The alignment rips 166 help, in cooperation with the adhesive dots 160, to freeze the chip-type component 106 in position within the package 100. Overmolding will finally complete the package 100. Leadframe fingers, forming the electric connection section 162, can be placed on one, some or all four package sides, if desired. The example of FIG. 18 shows an application for a three pin PSSO-3-9 package for a magnet sensor application with increased performance. The latter advantage is due to a significantly reduced ASIC package housing thickness, which can be scaled down for instance from 1 mm to 0.8 mm.

Referring to FIG. 19, a package 100 is illustrated which comprises a mechanical fixing structure 168 for mechanically fixing the component 106 at the carrier 102, and comprises a protecting surrounding structure 170 surrounding the connection structure 108 at an interface between the carrier 102 and the component 106. The mechanical fixing structure 168 is here embodied as a respective glue spot at a bottom side of the IC type component 106 and leadframe fingers of the carrier 102. The mechanical fixing structure 168 freezes the component 106 to the position of the carrier 102 for defining wire bonding for the formation of the connection structure 108. The protecting surrounding structure 170, which may form part of the encapsulant 110, is here embodied as a glob top encapsulation of the here tiny connection structure 108 and is applied after wire bonding. The component 106 again floats besides the leadframe type carrier 102 within an overmold compound, see encapsulant 110.

Descriptively speaking, the leadframe-type carrier 102 supports also in FIG. 19 the component 106, which is frozen in position by the support of glue material of the mechanical fixing structure 168. The latter is positioned below the carrier 102 and the component 106. The glop top, forming the protecting surrounding structure 170, is applied over carrier 102 and component 106, i.e. on a top side thereof, after wire bonding.

As an alternative to the architecture of FIG. 19, it is possible that an adhesive foil (for instance on epoxy based layer, non-cured) is applied for leadframe and die attach, i.e. as another embodiment of the mechanical fixing structure 168. Subsequently, a wire bonding process and an overmolding process may be carried out to include the adhesive foil into the package 100.

As yet another alternative to the architecture of FIG. 19, it is possible, instead of overmolding, to carry out an allover epoxy screen print process (for example epoxy based with epoxy curing process, or silicone gel) to create a mold package 100 with low effort.

Referring to FIG. 20, the connection structure 108 is configured as a further, here passive, electronic component 108' (for instance providing a capacitor function or an ohmic resistor function) having a first terminal 180 electrically contacting the component 106 and having a second terminal 182 electrically contacting the carrier 102 (compare FIG. 2). In other words, the further passive electronic component(s) 108', for instance embodied as a discrete or SMD part, support(s) the die position freeze according to FIG. 20 by a solder process and bridges the gap between a pad of carrier 102 to a solder pad on the electronic component 106 (which is here embodied again as an electronic chip or die). This can be accomplished again by a mechanical fixing structure 168, which may be made of a solder or glue material.

Referring to FIG. 21, the connection structure 108 is configured for electrically and mechanically connecting the component 106 with the carrier 102 with a single common integral structure. In the embodiment of FIG. 21, the connection structure 108 has a substantially oval shape and provides electrically conductive material for both an electrical and a mechanical connection between the chip-type component 106 on the one hand and the electrically conductive fingers of the carrier 102 on the other hand. Thus, the bond wires of FIG. 19 are replaced in FIG. 21 by electrically conductive material (which may be for instance dispensed) for providing a mechanical and an electrical connection.

Referring to FIG. 22, the carrier 102 comprises a printed circuit board (PCB) rather than a leadframe. The PCB type carrier 102 comprises an electrically insulating support plate 172 (for instance made of FR4 material) defining an accommodation through hole 104 in which the component 106 is accommodated, and comprises electrically conductive traces 174 (for instance copper structures) on the support plate 172 and being electrically connected with the component 106 via the connection structure 108. According to FIG. 22, the carrier 102 therefore has an interior hole forming the accommodation through hole 104 in which the chip-type component 106 is inserted. As an FIG. 21, the connection structure 108 is configured also in FIG. 22 for electrically and mechanically connecting the component 106 with the carrier 102 with a single common integral structure. More specifically, the connection structure 108 of FIG. 22 is conductive material for providing an electrical connection from silicon bumped pads of the component 106 to the PCB metal lines (compare reference 174). Thus, according to FIG. 22, the die gets embedded into the PCB by placing the die into a cavity within PCB. Then, the electrical connection gets formed, for example by conductive glue printing from the die bumped pads to PCB metal layer over the chip edge. Subsequently, a next PCB epoxy layer can be provided to seal the PCB with the embedded chip.

FIG. 23 to FIG. 28 show cross-sectional views of intermediate structures obtained during carrying out a method of manufacturing a package 100 according to another exemplary embodiment. In this embodiment, the leadframe type carrier 102 is formed by additive manufacturing, more specifically by three-dimensionally printing. In other words, the die type component 106 gets connected according to FIG. 23 to FIG. 28 by three dimensional printing. This can be accomplished for example by direct metal laser sintering. Thus, in this embodiment, the leadframe-type carrier 102 is printed on or besides the die-type component 106 using IC bumps for enabling an electric connection using bond wires as connection structure 108. Thus, a three-dimensional metal print technology is used according to FIG. 23 to FIG. 28 for forming carrier 102.

Figure 23:
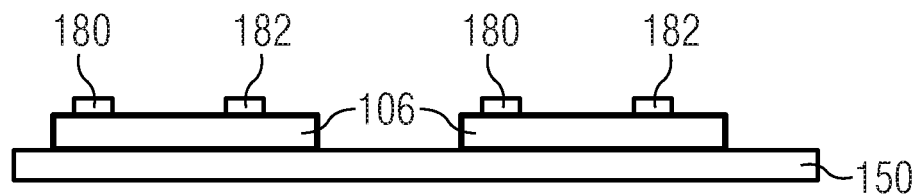

Referring to FIG. 23, components 106 (which are here embodied again as electronic chips with terminals 180, 182) are arranged on a support structure 150 (for instance a vacuum plate, a sticky tape, or a glass carrier with glue dot) by a pick and place operation.

Figure 24:
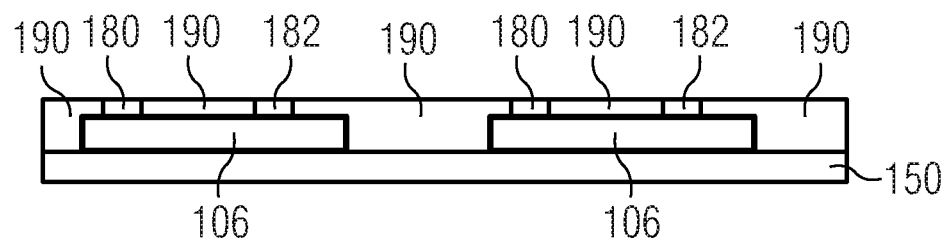

Referring to FIG. 24, 3D printable metal powder 190 is added to cover the components 106 and the support structure 150. Thus, the support structure 150 with the mounted components 106 gets into three dimensional method printing equipment.

Figure 25:
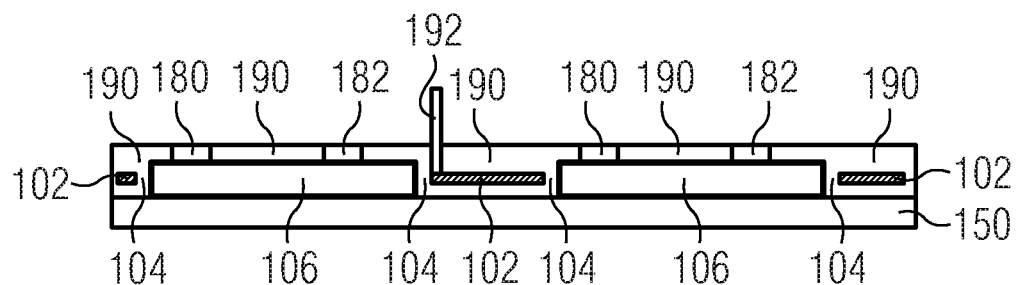

Referring to FIG. 25, formation of the leadframe type carrier 102 is initiated by carrying out a 3D laser printing procedure (compare laser beam 192). During this procedure, particles of the metal powder 190 are melted and subsequently re-solidified for selectively forming solid portions of the carrier 102 in melting regions (in the shown embodiment between the components 106 so as to embed them at carrier level). This procedure can be repeated for forming multiple layers by 3D printing, for instance until a target thickness (of for example 200 μm) of the carrier 102 is obtained.

Although not shown in the figures, it is also possible to start the 3D method printing procedure on the level of the terminals 180, 182 to connect the first 3D printed layer to the chip pads or bumps denoted with reference numerals 180, 182.

By the 3D printing process, the wiring or redistribution layer including the leadframe (for instance leadframe fingers, or leadless) may be formed.

Figure 26:
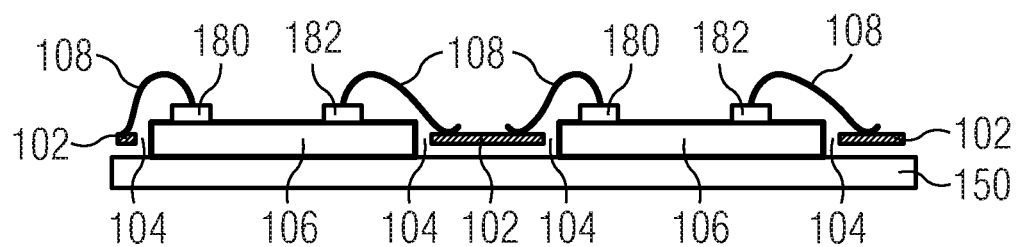

Referring to FIG. 26, excessive or remaining metal powder 190 can be removed after completing formation of the carrier 102. The terminals 180, 182 can be connected with the carrier 102 by wire bonding to thereby form the connection structure 108. Alternatively, it is also possible to form also the connection structure 108 by 3D printing.

Referring to FIG. 27, the structure obtained according to FIG. 26 may be encapsulated by an encapsulant 110 (for instance by overmolding the package 100). For this purpose, the printed leadframe with connected chips may be lifted to proceed with back end of the line (BEOL) processes. Singularization of the individual packages 100 may be accomplished by leadframe stamping. Thereafter, the package 100 may be tested, etc.

Referring to FIG. 28, the portion of the 3D printed carrier 102 extending beyond the encapsulant 110 may be trimmed, bent or formed.

It is advantageous that the 3D printed metal leadframe fingers of the carrier 102 are able to be soldered or welded based on a final plating finish. This may be promoted by a passivation or a glass layer on the chip top side and bumps with approximately 40 μm to get a 3D printing temperature away from sensitive chip areas. This can also be achieved by printing bumps on bumps and start leadframe redistribution layer over chip with higher distance to chip active areas.

Figure 29:
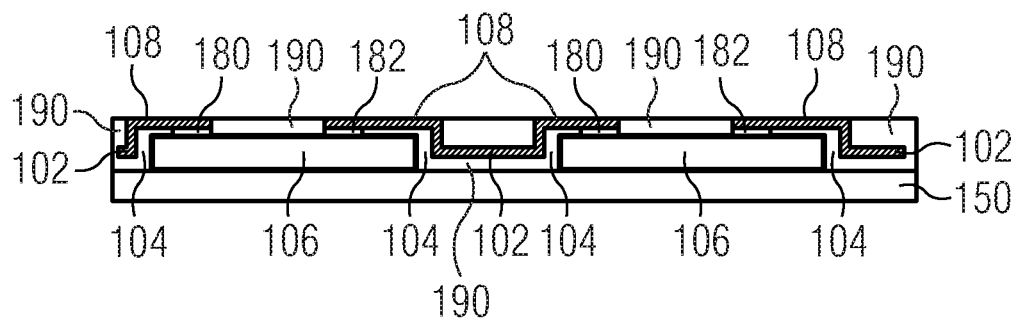
FIG. 29 to FIG. 31 show cross-sectional views of intermediate structures obtained during carrying out a method of manufacturing a package according to another exemplary embodiment.
Figure 30:
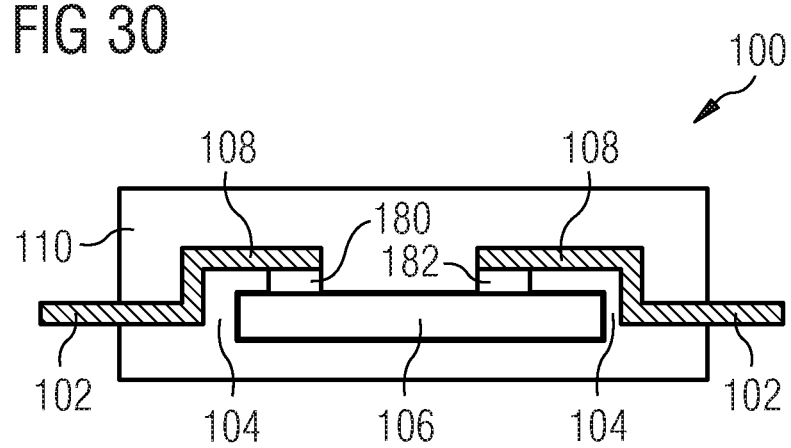
Figure 31:
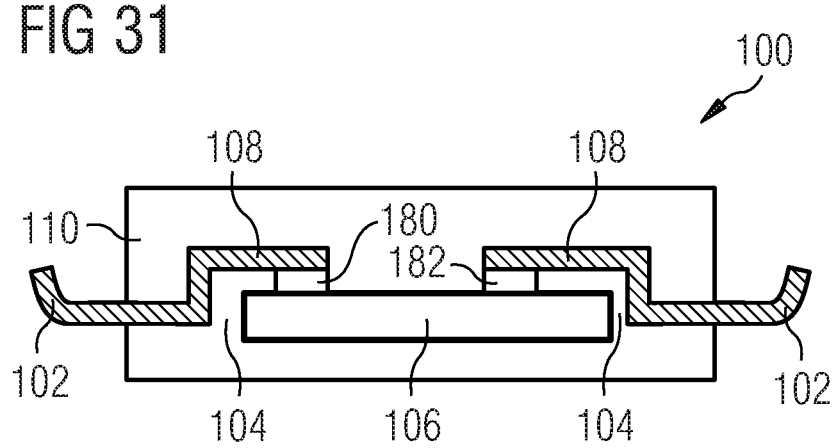

FIG. 29 to FIG. 31 show cross-sectional views of intermediate structures obtained during carrying out a method of manufacturing a package 100 according to still another exemplary embodiment. Also in this embodiment, the leadframe type carrier 102 is formed by additive manufacturing, more specifically by three-dimensionally printing.

However, in contrast to the embodiment described above referring to FIG. 23 to FIG. 28, the embodiment of FIG. 29 to FIG. 31 makes it dispensable to form wire bonds. In contrast to this, according to FIG. 29 to FIG. 31, also the entire connection structure 108 is formed by three dimensionally printing.

In this embodiment, a first part of the manufacturing process can be carried out as described above referring to FIG. 23 to FIG. 25.

Starting from the structure shown in FIG. 25, the manufacturing process may then be continued as shown in FIG. 29. In this context, not only the portions of the carrier 102 at component level (defining accommodation through holes 104) are formed by three dimensionally printing, but also portions of the connection structure 108 above component level (which functionally correspond to the bond wires in FIG. 26 to FIG. 28). After having formed the entire connection structures 108 as well as the carrier 102 exclusively by three dimensionally printing, the remaining metal powder 190 may be removed.

As can be taken from FIG. 30, the obtained structure may then be encapsulated by overmolding, thereby forming encapsulant 110.

As can be taken from FIG. 31, the obtained structure may then be further processed by bending portions of the carrier 102 extending beyond the encapsulant 110.

Descriptively speaking, the embodiment of FIG. 29 to FIG. 31 makes it possible to connect the component 106 (such as an electronic chip) directly to leadframe type carrier 102 by a three dimensionally printed metal redistribution layer. This may allow to avoid wire bonding at all.

It should be noted that the term "comprising" does not exclude other elements or features and the "a" or "a" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, and composition of matter, means, methods and steps described in the specification. Accordingly, the appended claims are intended to include within their scope such processes, machines, manufacture, compositions of matter, means, methods, or steps.

What is claimed is:

1. A package, comprising:
   a carrier having an accommodation through hole;
   a component arranged within the accommodation through hole, wherein a first portion of the component protrudes beyond a first main surface of the carrier and a second portion of the component protrudes beyond an opposing second main surface of the carrier; and
   a connection structure connecting the carrier with the component, wherein the connection structure contacts the first main surface and the opposing second main surface of the carrier, and wherein the connection structure contacts side edges of the component.

2. The package according to claim 1, wherein the connection structure is arranged at least partially within the accommodation through hole, wherein the connection structure is electrically conductive.

3. The package according to claim 1, wherein the connection structure comprises one of the group consisting of glue, solder, a bond wire, a bond ribbon, a clip, an adhesive film, and a further component, in particular a surface mounted device component, more particularly an ohmic resistor or a ceramic capacitor.

4. The package according to claim 1, comprising an electronic chip mounted on the carrier.

5. The package according to claim 4, wherein the component and the electronic chip are spaced at different sections of the carrier.

6. The package according to claim 1, wherein a first portion of the connection structure protrudes beyond a first main surface of the carrier and another second portion of the connection structure protrudes beyond an opposing second main surface of the carrier.

7. The package according to claim 1, wherein the connection structure comprises two separate connection bodies, both being substantially C-shaped.

8. The package according to claim 1, wherein the component is one of the group consisting of a surface mounted device component, in particular a ceramic capacitor, and an electronic chip.

9. The package according to claim 1, wherein the component is floatingly located within the package, within an encapsulant, and apart from the carrier.

10. A package, comprising:
    a carrier;
    a component located laterally beside the carrier and at least partially on carrier level;
    a connection structure connecting the carrier with the component;
    a mechanical fixing structure extending laterally between an upper main surface or a lower main surface of the component and the carrier for mechanically fixing the component at the carrier;
    a protecting surrounding structure surrounding the connection structure at an interface between the carrier and the component; and
    an encapsulant encapsulating the protection surrounding structure and at least part of the carrier and the component.

11. The package according to claim 10, wherein the package further comprises an electronic chip mounted on the carrier.

12. The package according to claim 10, wherein the carrier comprises an electric connection section electrically connecting the component via the connection structure, and comprises a mechanical supporting section supporting the component via at least one adhesive dot for fixing a position of the component.

13. The package according to claim 10, wherein the connection structure is configured as a further electronic component having a first terminal electrically contacting the component and having a second terminal electrically contacting the carrier.

14. The package according to claim 10, wherein the connection structure is configured for electrically and mechanically connecting the component with the carrier.

15. The package according to claim 10, wherein the carrier comprises an electrically insulating support plate defining an accommodation recess in which the component is accommodated, and comprises electrically conductive traces on the support plate and being electrically connected with the component via the connection structure.

16. A method of manufacturing a package, comprising:
    providing a carrier with an accommodation through hole;
    arranging a component within the accommodation through hole so that one portion protrudes beyond a first main surface of the carrier and another portion protrudes beyond an opposing second main surface of the carrier;
    forming a connection structure for connecting the carrier with the component, wherein the connection structure contacts the first main surface and the opposing second main surface of the carrier, and wherein the connection structure contacts side edges of the component.

17. The method according to claim 16, wherein the method comprises:
    dispensing material of the connection structure between the carrier and the component on one of the portions; and
    triggering reflow of the dispensed material so that the material flows partially to the other one of the portions.

18. The method according to claim 16, wherein the method comprises providing a support structure with a cavity and arranging the component in the cavity and the carrier outside of the cavity before forming the connection structure.

* * * * *